(12) United States Patent
Akiba et al.

(10) Patent No.: US 12,356,541 B2
(45) Date of Patent: Jul. 8, 2025

(54) ELECTRONIC CONTROL DEVICE

(71) Applicant: Hitachi Astemo, Ltd., Hitachinaka (JP)

(72) Inventors: Ryo Akiba, Hitachinaka (JP); Yoshio Kawai, Hitachinaka (JP)

(73) Assignee: HITACHI ASTEMO, LTD., Ibaraki (JP)

( * ) Notice: Subject to any disclaimer, the term of this patent is extended or adjusted under 35 U.S.C. 154(b) by 203 days.

(21) Appl. No.: 17/797,541

(22) PCT Filed: Dec. 28, 2020

(86) PCT No.: PCT/JP2020/049084
§ 371 (c)(1),
(2) Date: Aug. 4, 2022

(87) PCT Pub. No.: WO2021/171779
PCT Pub. Date: Sep. 2, 2021

(65) Prior Publication Data
US 2023/0354509 A1    Nov. 2, 2023

(30) Foreign Application Priority Data

Feb. 28, 2020  (JP) ................................. 2020-033927

(51) Int. Cl.
*H05K 1/00* (2006.01)
*H05K 1/02* (2006.01)

(52) U.S. Cl.
CPC . *H05K 1/0259* (2013.01); *H05K 2201/09827* (2013.01); *H05K 2201/10371* (2013.01); *H05K 2201/10606* (2013.01)

(58) Field of Classification Search
CPC ....... H05K 1/0259; H05K 2201/09827; H05K 2201/10371; H05K 2201/10606
See application file for complete search history.

(56) References Cited

U.S. PATENT DOCUMENTS

| | | | |
|---|---|---|---|
| 2004/0009078 | A1 | 1/2004 | Kimura et al. |
| 2008/0074772 | A1 | 3/2008 | Yamasaki et al. |
| | | (Continued) | |

FOREIGN PATENT DOCUMENTS

| | | |
|---|---|---|
| EP | 3246601 A1 | 11/2017 |
| JP | 01-116893 U | 8/1989 |
| | (Continued) | |

OTHER PUBLICATIONS

WO 2019/065423 A1 (Year: 2019).*
(Continued)

*Primary Examiner* — Pete T Lee
(74) *Attorney, Agent, or Firm* — Volpe Koenig

(57) ABSTRACT

An electronic control device capable of suppressing failure of an electronic component due to static electricity is provided. An electronic control device that controls an actuator includes a circuit board, an electronic component mounted on the circuit board, a resin case (insulating case) that holds the circuit board, a metal cover (first conductive cover) that covers the resin case, an actuator cover (second conductive cover) that holds the resin case and covers an opening portion of the actuator, and a conductive portion that make the metal cover (first conductive cover) and the actuator cover (second conductive cover) conductive.

26 Claims, 30 Drawing Sheets

(56) References Cited

U.S. PATENT DOCUMENTS

| | | | |
|---|---|---|---|
| 2010/0056329 A1 | 3/2010 | Konig et al. | |
| 2011/0194267 A1* | 8/2011 | Sun | H05K 9/0015 |
| | | | 361/807 |
| 2012/0237376 A1 | 9/2012 | Kinoshita et al. | |
| 2016/0322721 A1* | 11/2016 | Kitagawa | H01R 12/58 |
| 2019/0075673 A1 | 3/2019 | Kogure | |
| 2021/0362592 A1 | 11/2021 | Takahashi et al. | |

FOREIGN PATENT DOCUMENTS

| | | | |
|---|---|---|---|
| JP | 2004-100684 A | 4/2004 | |
| JP | 2007-221976 A | 8/2007 | |
| JP | 2008-215236 A | 9/2008 | |
| JP | 2012-193660 A | 10/2012 | |
| JP | 2014-075496 A | 4/2014 | |
| JP | 2016-220479 A | 12/2016 | |
| JP | 2017-139934 A | 8/2017 | |
| WO | 2019/065423 A1 | 4/2019 | |

OTHER PUBLICATIONS

Japanese Office Action issued Jul. 4, 2023 for Japanese Patent Application No. 2022-503124.
Extended European Search Report issued on Feb. 22, 2024 for European Patent Application No. 20921701.7.
International Search Report, PCT/JP2020/049084, Mar. 30, 2021, 2 pgs.

* cited by examiner

A-A

A-A

ELECTRONIC CONTROL DEVICE

TECHNICAL FIELD

The present invention relates to an electronic control device.

BACKGROUND ART

In recent years, an electronic control device for a vehicle has been mechanically and electrically integrated in view of an increase in the number of electronic control devices mounted on a vehicle and a reduction in the length of a connection cable between a control device and a sensor and between a control device and an actuator. Specifically, integration of an engine control actuator and an electronic control device, integration of a transmission and an electronic control device, and the like are exemplified. Here, a surface temperature of an engine, a transmission, and the like is about 130° C. to 140° C., whereas a heat-resistant temperature of an electronic component used in an electronic control device is about 150° C.

When the electronic control device is operated in such a severe environment, heat of the engine, the transmission, and the like is transmitted via a case (housing) of the electronic control device to the electronic component on a substrate held by the case, and a temperature of the electronic component may exceed the heat-resistant temperature.

CITATION LIST

Patent Literature

PTL 1: JP 2014-075496 A

SUMMARY OF INVENTION

Technical Problem

In the electronic control device disclosed in PTL 1, since the case for holding the substrate is made from metal (alloy), heat of the engine, the transmission, and the like is easily transmitted to the electronic component via the case (housing). In view of the above, in order to suppress a temperature rise of the electronic component due to heat of the engine, the transmission, and the like, it is conceivable to make a case (heat source side) of the electronic control device from resin.

However, in a case where static electricity is applied to a metallic case (on the atmosphere side) from a user's hand or the like, there arises a new problem that discharge is not performed to the ground (GND) via the case unlike a conventional structure. When static electricity is discharged from the metallic case to the electronic component, there is a concern that the electronic component may fail.

An object of the present invention is to provide an electronic control device capable of suppressing failure of an electronic component due to static electricity.

Solution to Problem

In order to achieve the above object, the present invention relates to an electronic control device that controls an actuator. The electronic control device includes a circuit board, an electronic component mounted on the circuit board, an insulating case that holds the circuit board, a first conductive cover that covers the insulating case, a second conductive cover that holds the insulating case and covers an opening portion of the actuator, and a conductive portion that makes the first conductive cover and the second conductive cover conductive.

Advantageous Effects of Invention

According to the present invention, it is possible to suppress failure of an electronic component due to static electricity. An object, a configuration, and an advantageous effect other than those described above will be clarified in description of an embodiment described below.

DESCRIPTION OF EMBODIMENTS

Figure 1:
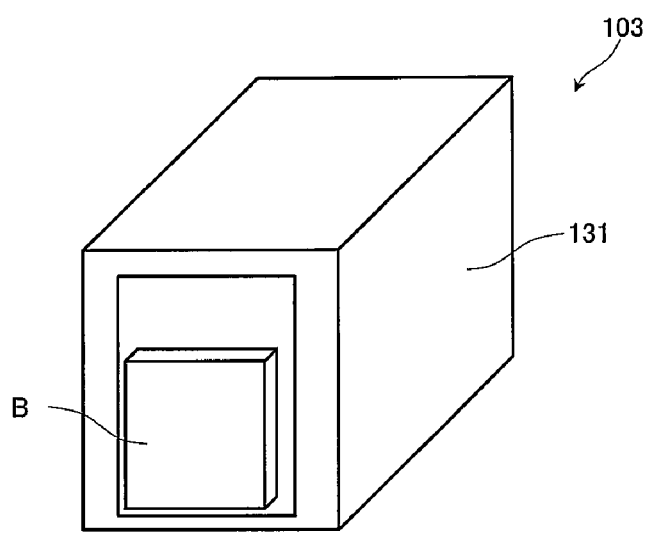
FIG. 1 is a schematic perspective view of a transmission to which an electronic control device is attached.

Hereinafter, an embodiment of an electronic control device according to the present invention will be described in detail with reference to the accompanying drawings. The electronic control device controls, for example, an actuator (electromagnetic valve or the like) used for an engine, a transmission, and the like. Note that, in the drawings, the same reference numerals denote the same parts.

(Schematic Configuration of Transmission)

FIG. 1 is a schematic perspective view of a transmission 103 to which an electronic control device B is attached, and illustrates an example of mechanical and electronical integration in the transmission 103. In FIG. 1, the transmission 103 includes a mechanism unit (not illustrated) that changes a rotational driving force of an engine or the like and transmits the rotational driving force, and a transmission case 131 that accommodates the mechanism unit.

Lubricating oil for lubricating the mechanism unit is stored in the transmission case 131. The electronic control device (transmission control unit: TCU) B is attached to the transmission case 131. The transmission 103 and the electronic control device B are arranged in an engine room (not illustrated).

(Connector)

Figure 2A:
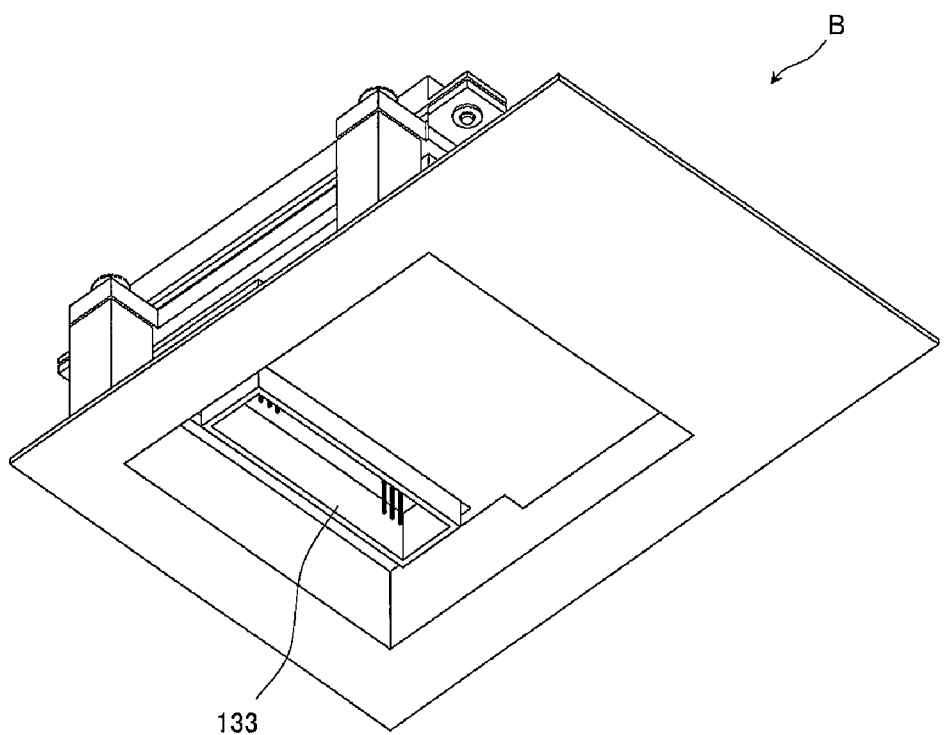
FIG. 2A is a schematic perspective view of a connector (male) on the electronic control device side.
Figure 2B:
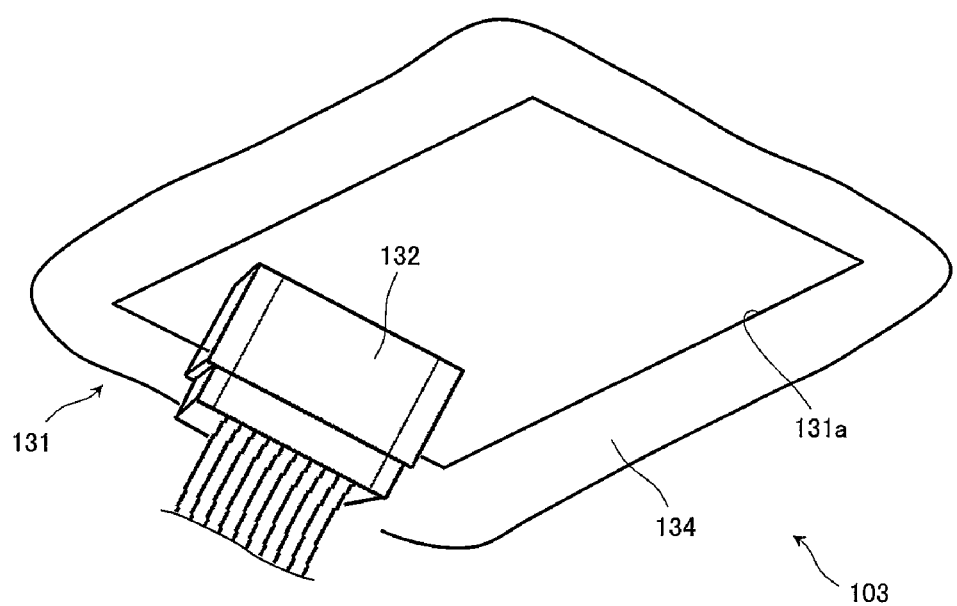
FIG. 2B is a schematic perspective view of a connector (female) on the transmission side.

FIG. 2A is a schematic perspective view of a connector (male) on the electronic control device B side, and FIG. 2B is a schematic perspective view of a connector (female) on the transmission 103 side. As illustrated in FIGS. 2A and 2B, the transmission 103 is electrically connected to the electronic control device B via transmission connectors 132 and 133. The transmission connector 132 protrudes from the transmission case 131 for electrical connection with the electronic control device B. The electronic control device B is attached to a main body portion 134 of the transmission case 131 in a manner to close an opening portion 131a of the transmission case 131.

COMPARATIVE EXAMPLE

Figure 3:
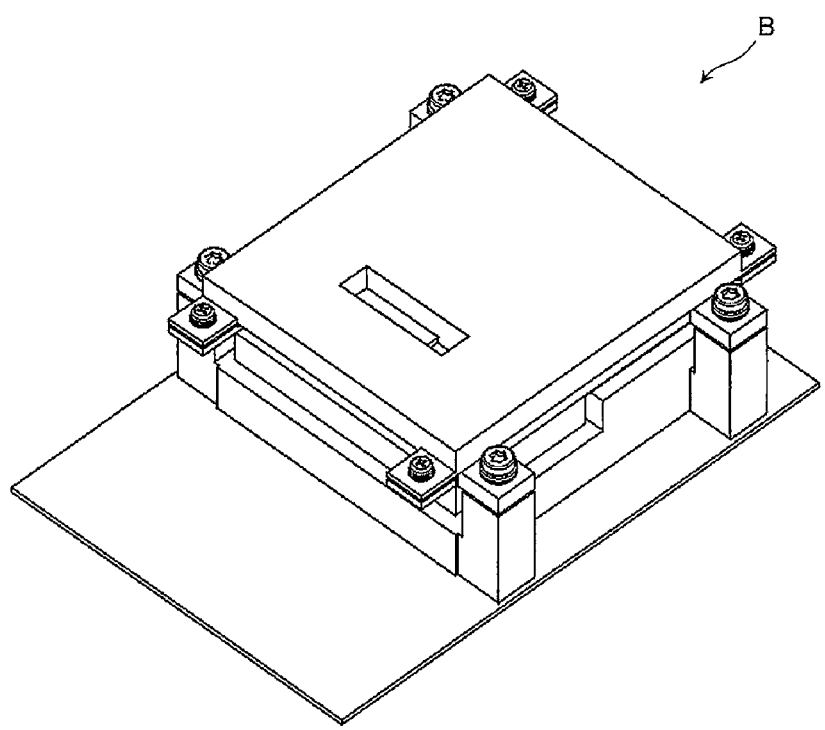
FIG. 3 is a perspective view of the electronic control device.
Figure 4:
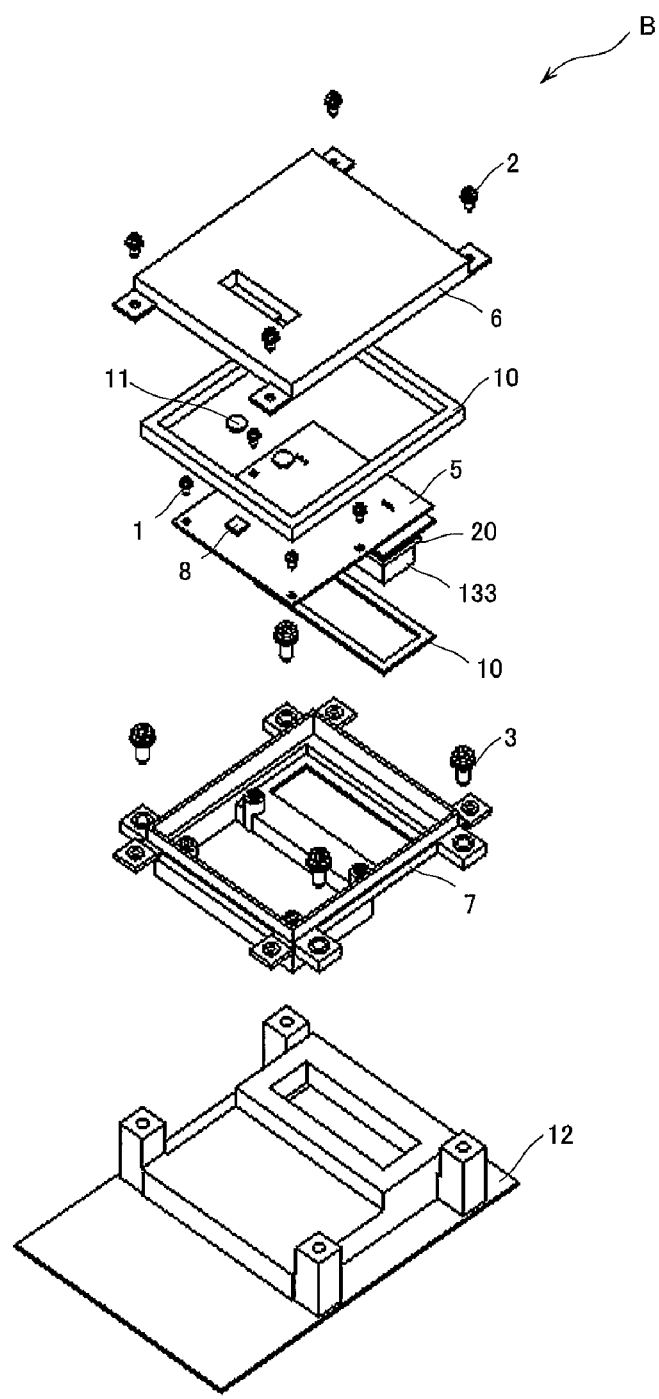
FIG. 4 is a developed view of the electronic control device.
Figure 5A:
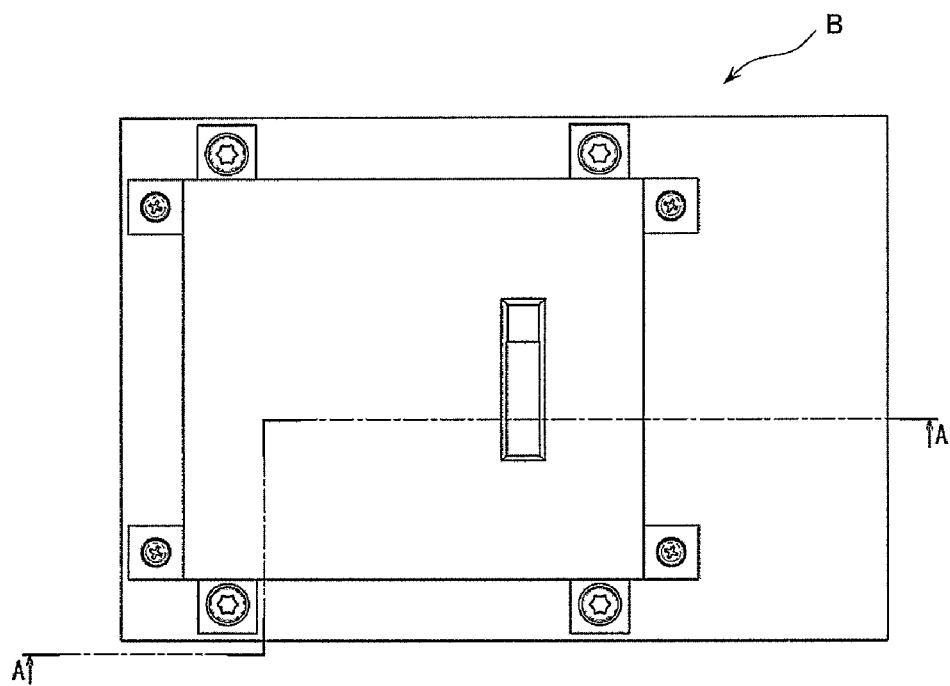
FIG. 5A is a diagram illustrating a cutting line of the electronic control device.
Figure 5B:
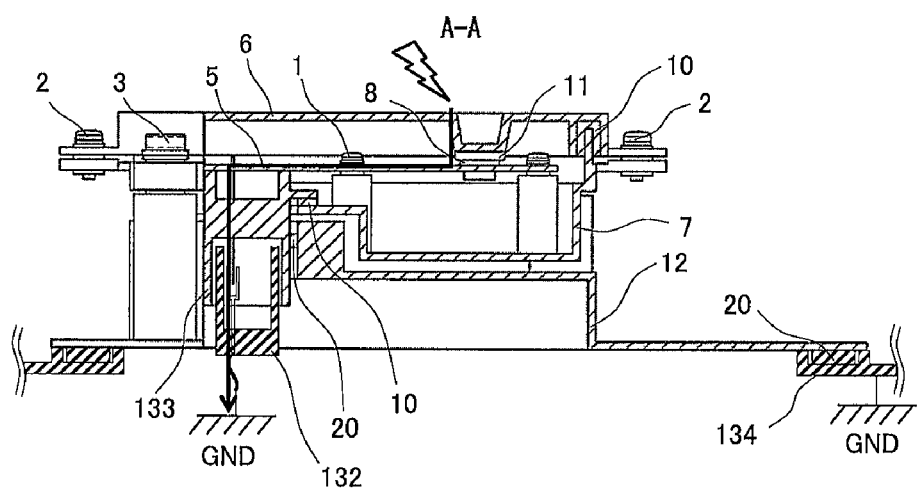
FIG. 5B is a cross-sectional view of the electronic control device.
Figure 6:
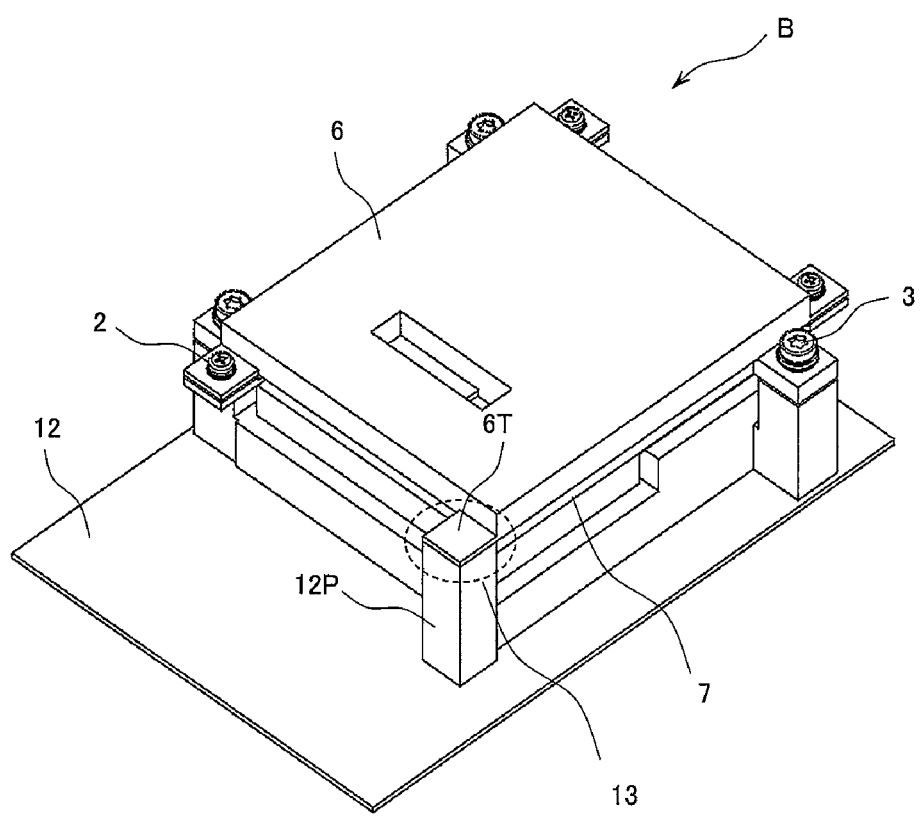
FIG. 6 is a perspective view of the electronic control device according to a first embodiment of the present invention.
Figure 7:
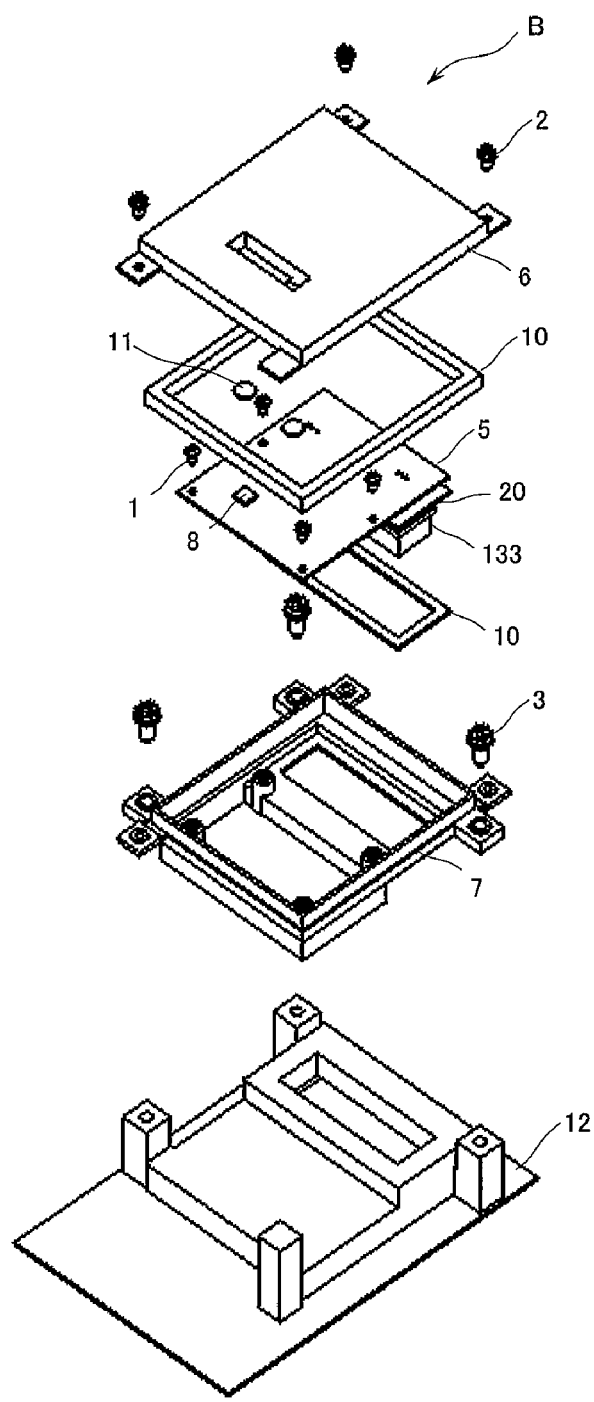
FIG. 7 is a developed view of the electronic control device according to the first embodiment of the present invention.
Figure 8A:
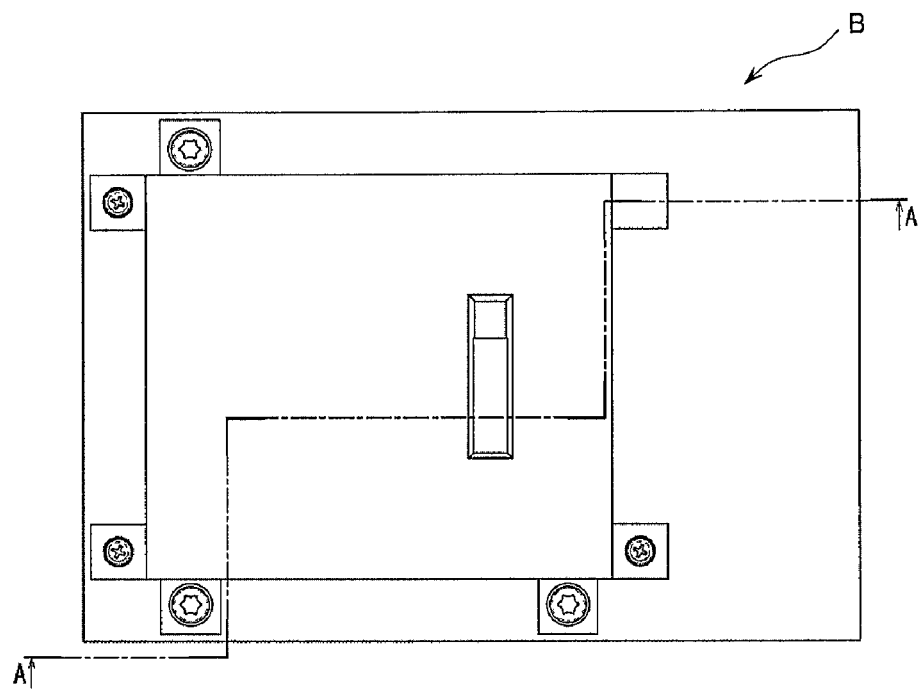
FIG. 8A is a diagram illustrating a cutting line of the electronic control device according to the first embodiment of the present invention.
Figure 8B:
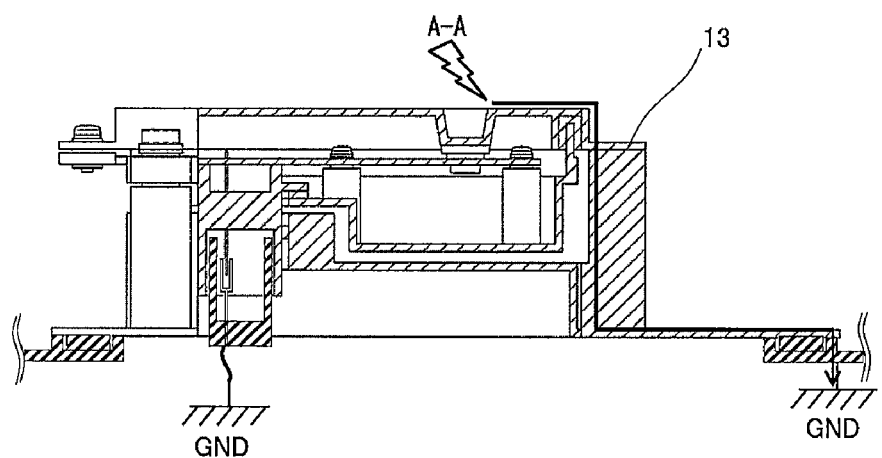
FIG. 8B is a cross-sectional view of the electronic control device according to the first embodiment of the present invention.
Figure 9:
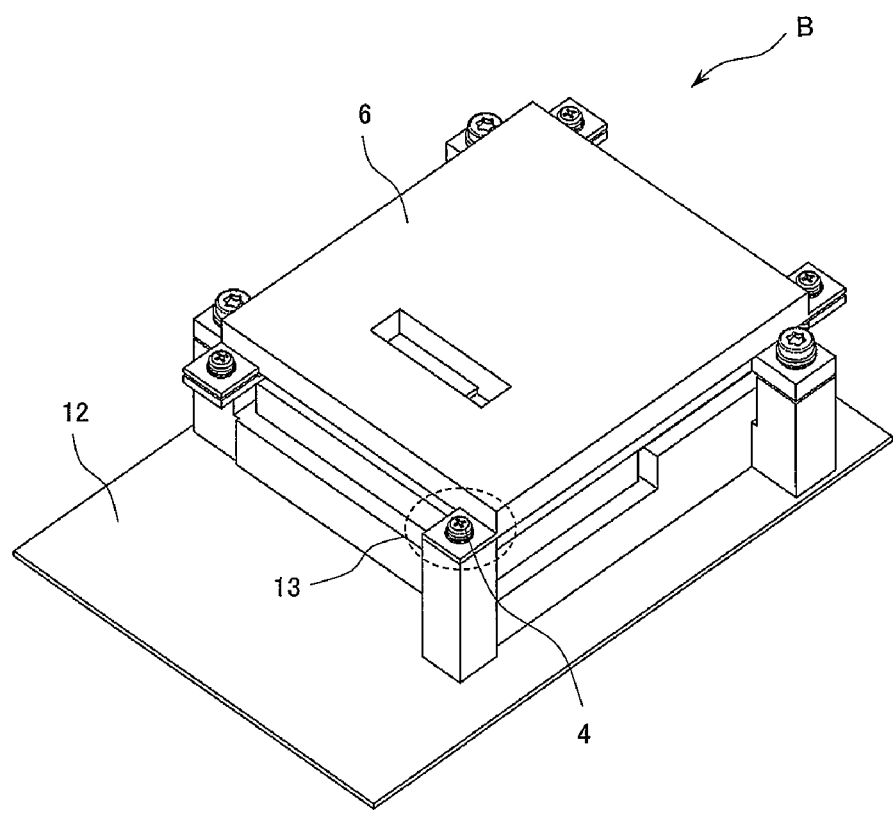
FIG. 9 is a perspective view of the electronic control device according to a second embodiment of the present invention.
Figure 10:
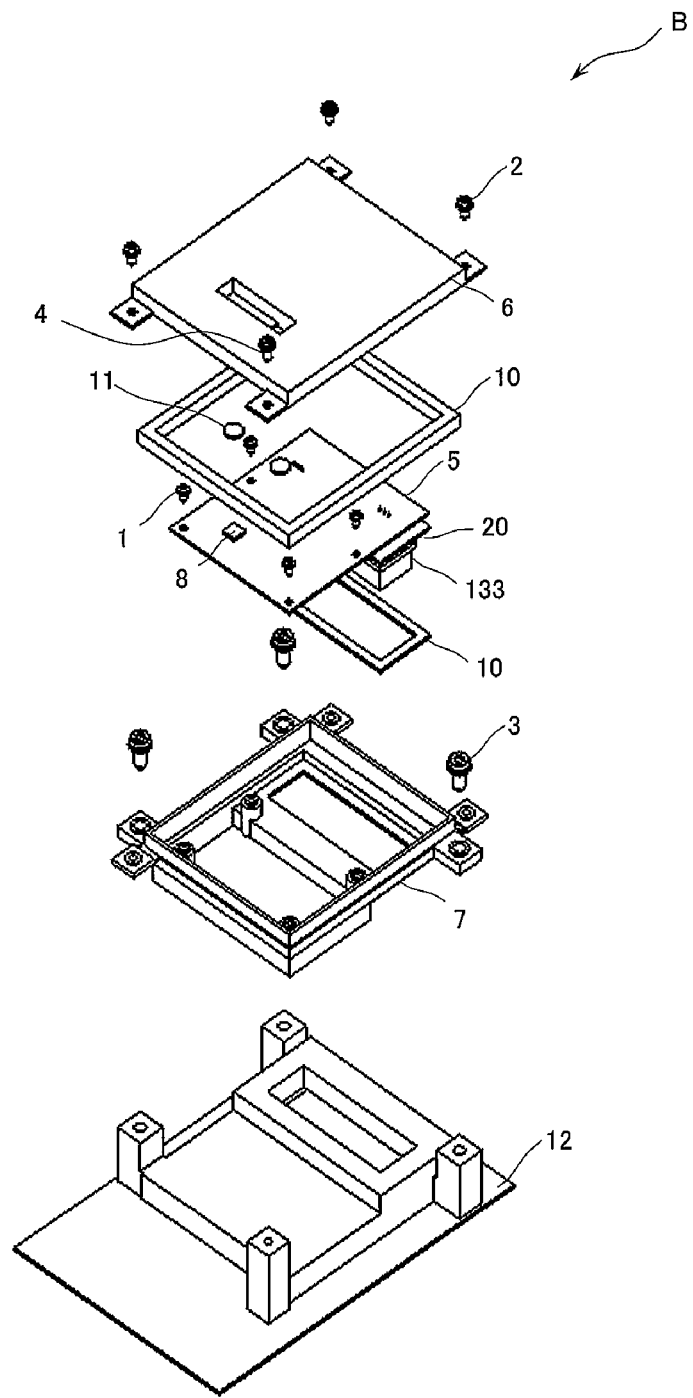
FIG. 10 is a developed view of the electronic control device according to the second embodiment of the present invention.
Figure 11A:
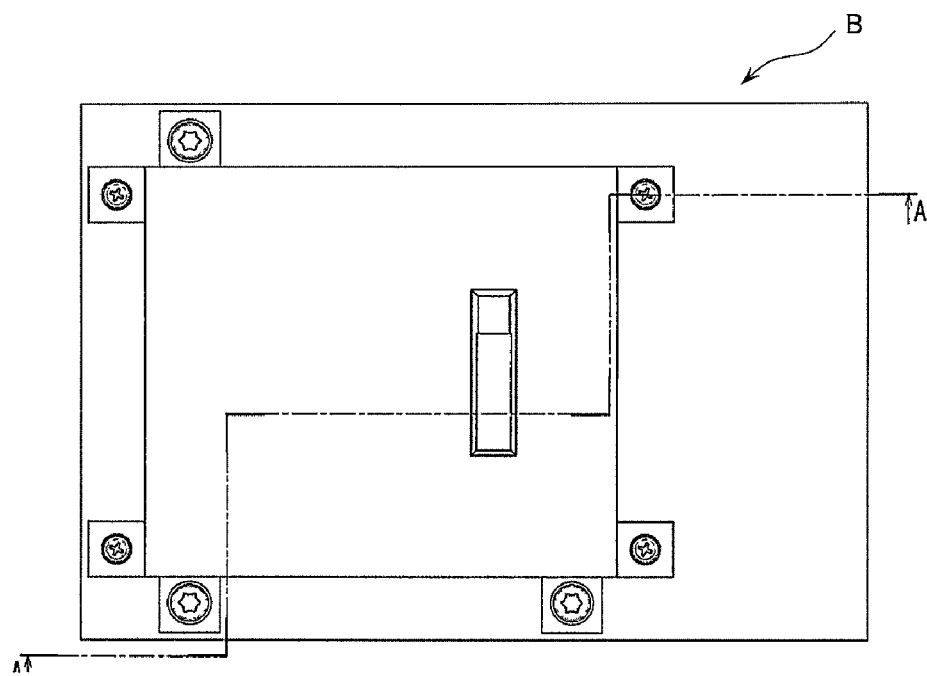
FIG. 11A is a diagram illustrating a cutting line of the electronic control device according to the second embodiment of the present invention.
Figure 11B:
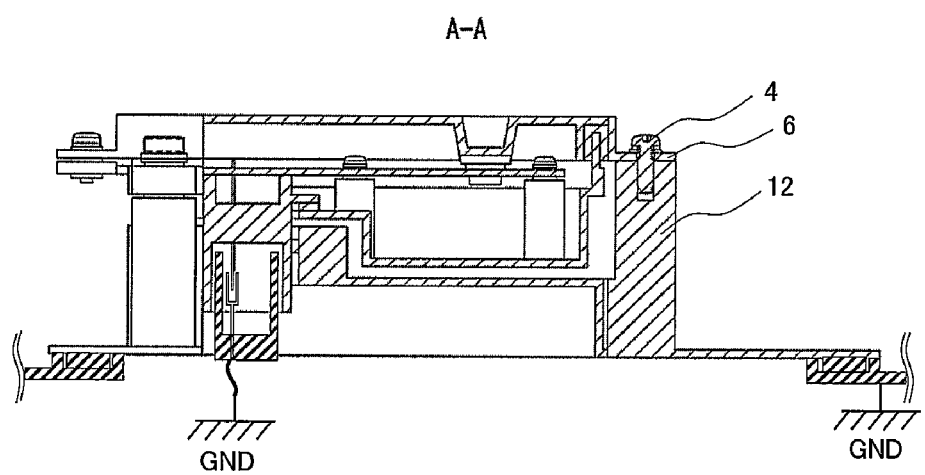
FIG. 11B is a cross-sectional view of the electronic control device according to the second embodiment of the present invention.
Figure 12:
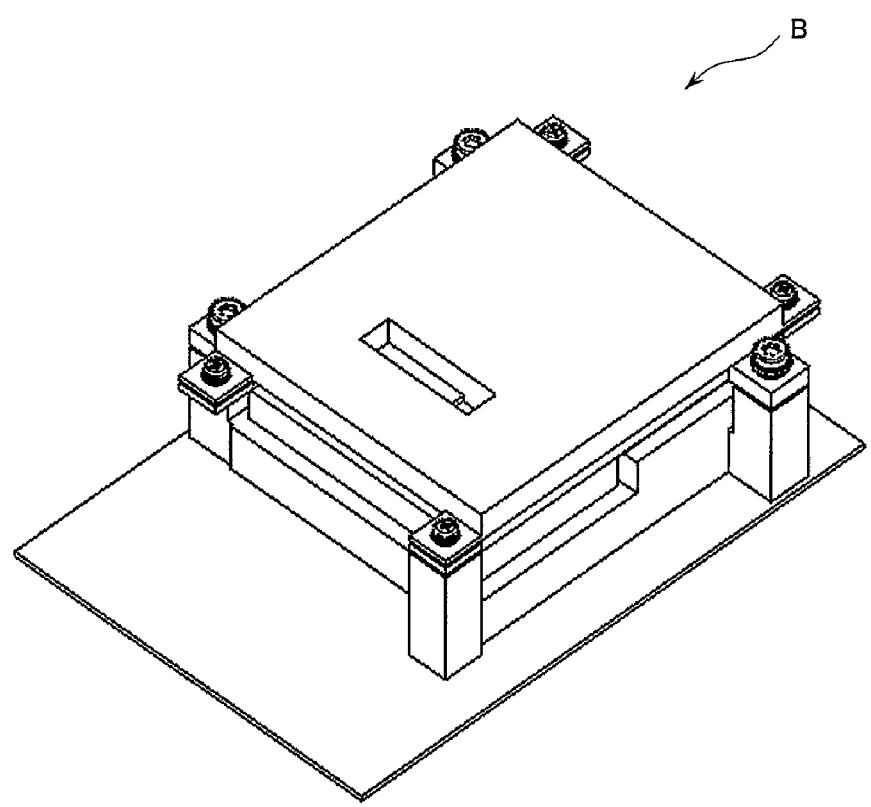
FIG. 12 is a perspective view of the electronic control device according to a third embodiment of the present invention.
Figure 13:
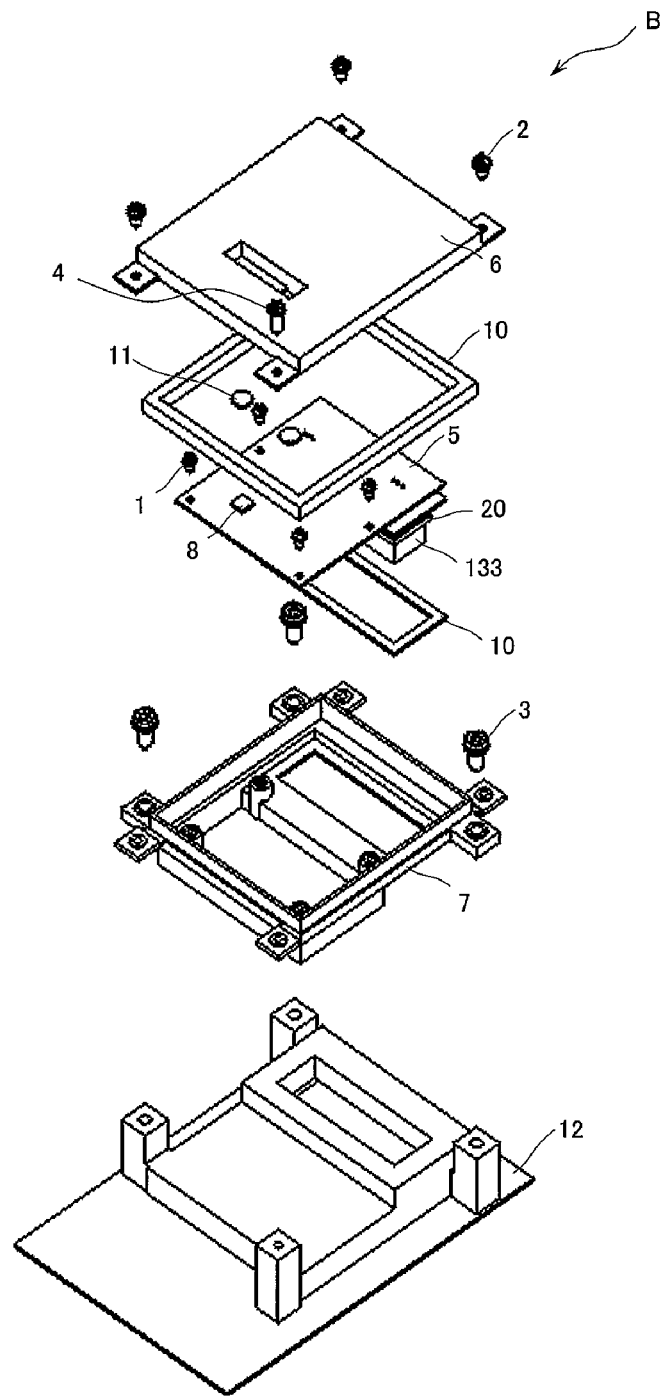
FIG. 13 is a developed view of the electronic control device according to the third embodiment of the present invention.
Figure 14A:
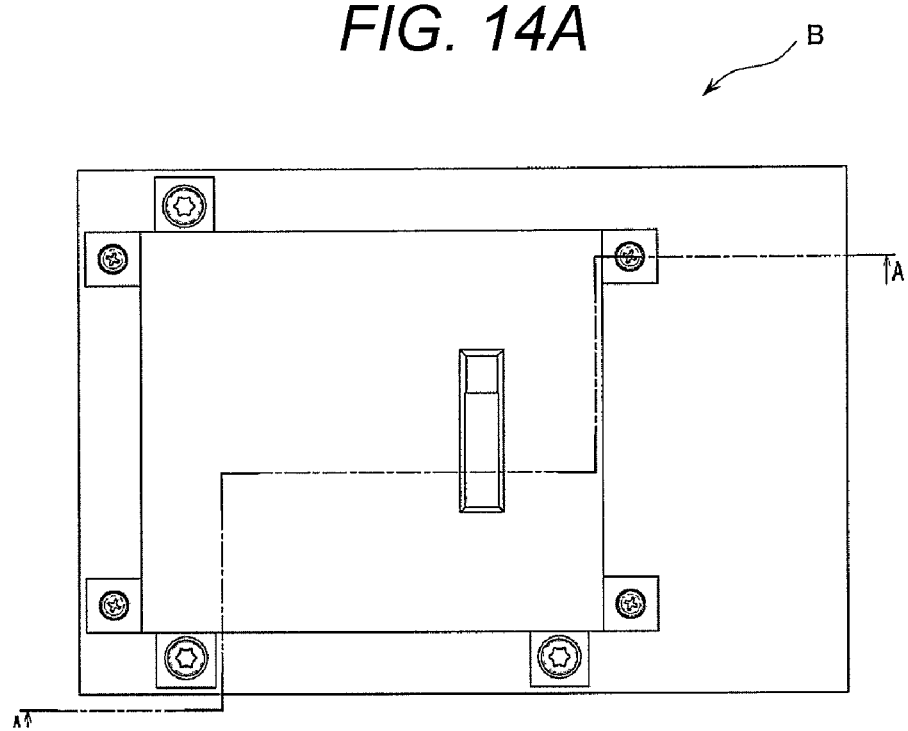
FIG. 14A is a diagram illustrating a cutting line of the electronic control device according to the third embodiment of the present invention.
Figure 14B:
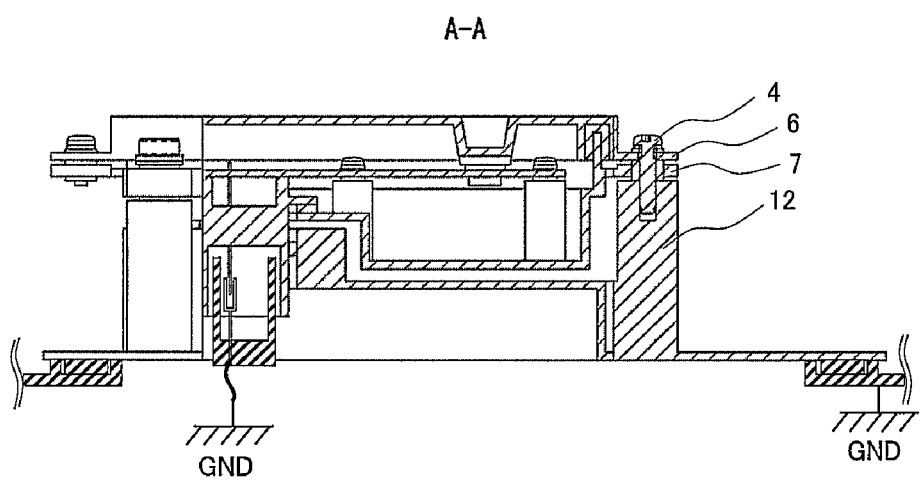
FIG. 14B is a cross-sectional view of the electronic control device according to the third embodiment of the present invention.
Figure 15:
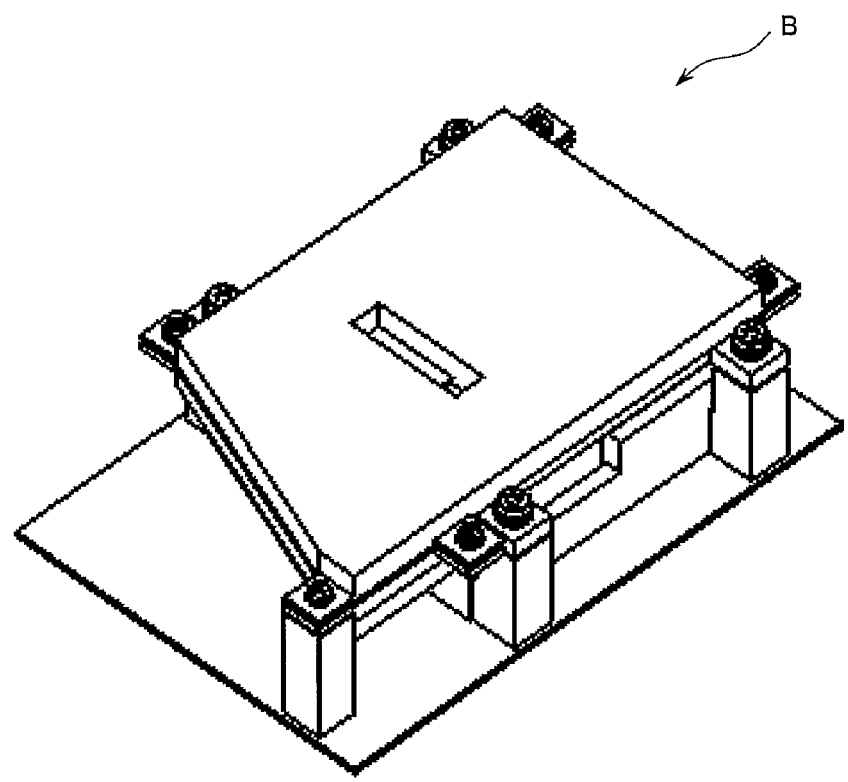
FIG. 15 is a perspective view of the electronic control device according to a fourth embodiment of the present invention.
Figure 16:
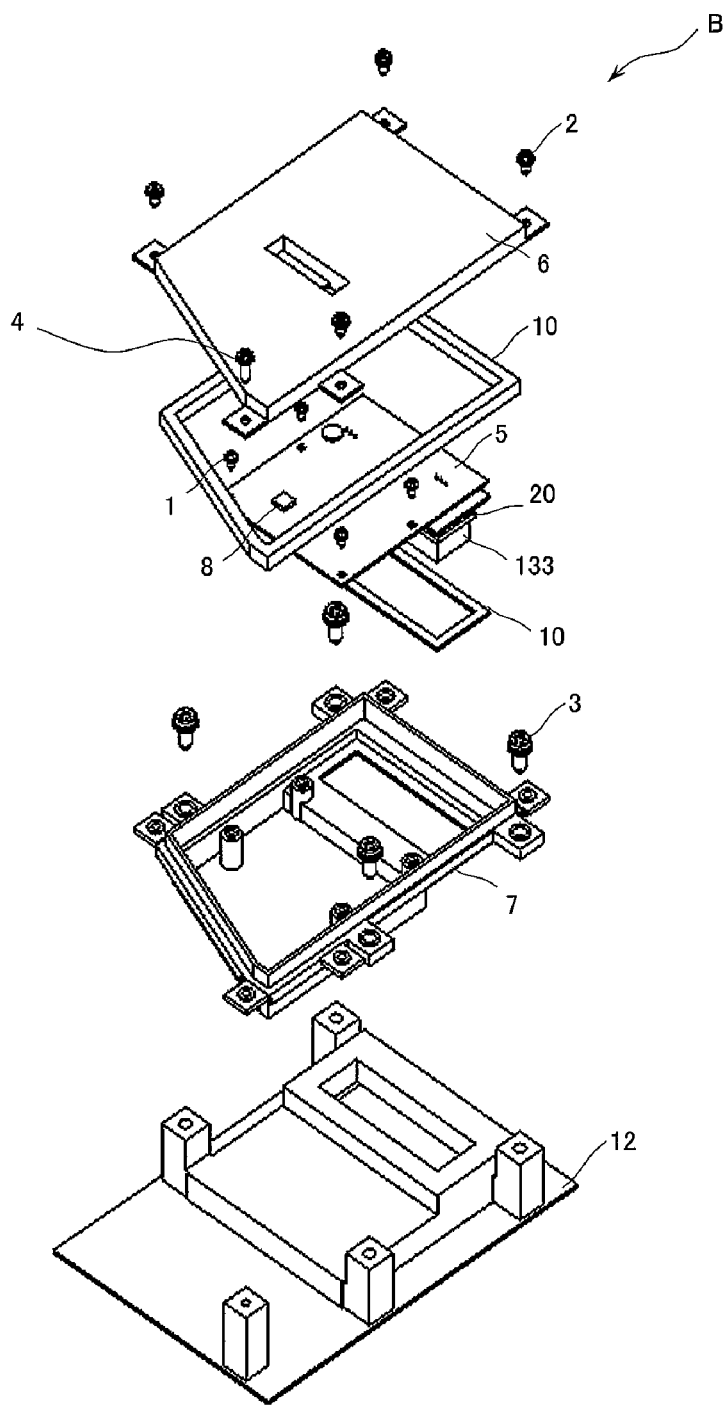
FIG. 16 is a developed view of the electronic control device according to the fourth embodiment of the present invention.
Figure 17A:
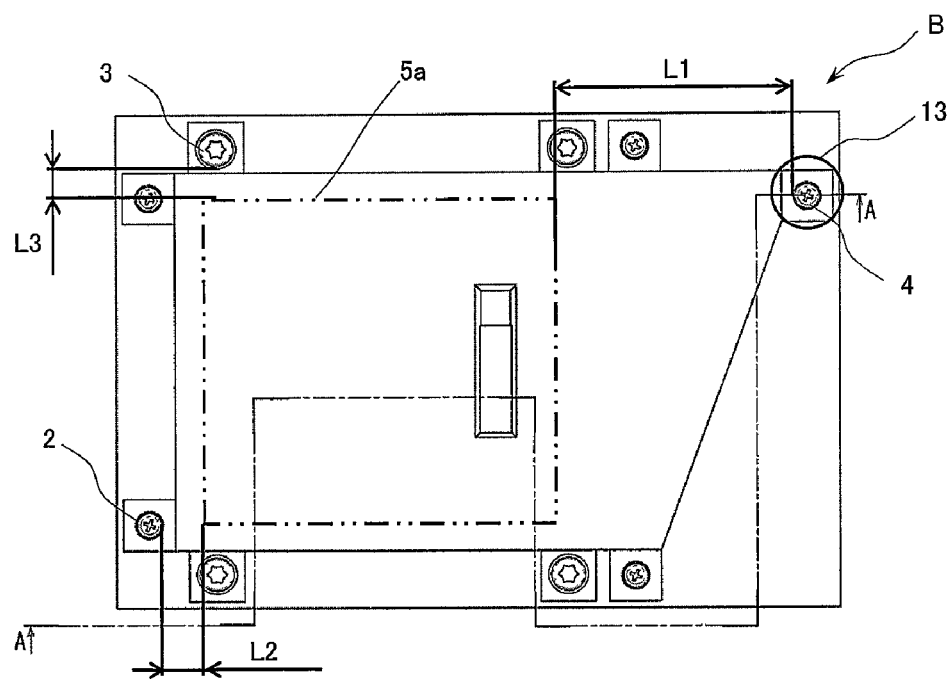
FIG. 17A is a diagram illustrating a cutting line of the electronic control device according to the fourth embodiment of the present invention.
Figure 17B:
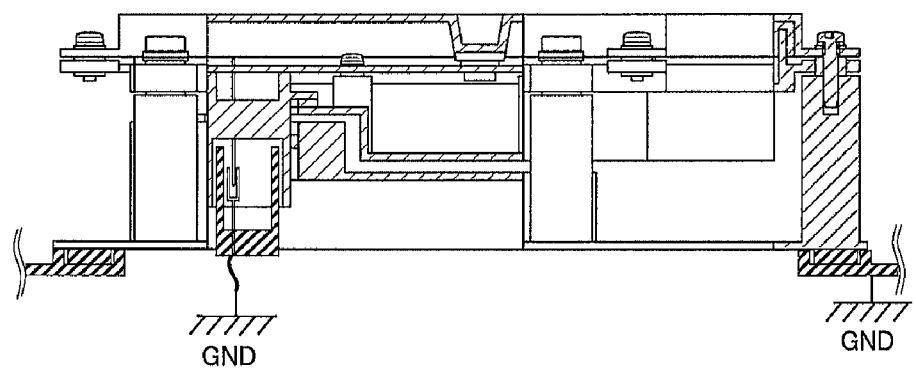
FIG. 17B is a cross-sectional view of the electronic control device according to the fourth embodiment of the present invention.

FIG. 3 is a perspective view of the electronic control device B which is a comparative example with the present invention, FIG. 4 is an exploded perspective view of the electronic control device B, and FIGS. 5A and 5B are cross-sectional views of the electronic control device B. The electronic control device B is, for example, mounted on an automobile and used for controlling an engine, a transmission, a brake, or the like, and is substantially composed of a circuit board 5 on which an electronic component 8 is mounted, a connector 133 which is mounted on the circuit board 5 and electrically connects an electric circuit formed on the circuit board 5 and an external device, a case 7 made from resin in which the circuit board 5 is accommodated, and a cover 6 made from metal covering the circuit board 5 accommodated in the case 7. Note that, in practice, a plurality of electronic components is mounted on the circuit board 5 in addition to the electronic component 8 illustrated. The circuit board 5 is held by the resin case 7 by, for example, a fixing member 1 (for example, a screw).

The metal cover 6 is held in the resin case 7 by fixing member 2 (for example, a screw) or the like. Further, a sealing member 10 such as an adhesive, for example, is arranged between the metal cover 6 and the resin case 7 and between the metal cover 6 or the resin case 7 and the connector 133 so that the inside of the electronic control device is hermetically sealed. A heat conductive material 11 such as grease, for example, is arranged between the electronic component 8 and the metal cover 6 or between the circuit board 5 and the metal cover 6, so that a temperature rise of the electronic component can be suppressed.

The resin case 7 is held in an actuator cover 12 made from metal by a fixing member 3 (for example, a screw) or the like. For example, rubber packing 20 or the like is arranged between the actuator cover 12 and the connector 133 and between the actuator cover 12 and the main body portion 134 of the transmission case to liquid-tightly seal the inside of the transmission. With such a configuration, received heat from the lubricating oil that may have a high temperature inside the transmission can be made less likely to be transmitted to the metal cover 6 by the resin case 7 having a low heat conductivity.

However, in a case where static electricity is applied to the metal cover 6 from a user's hand or the like, there arises a new problem that discharge is not performed to the ground (GND) through the case. In the present structure, electricity is conducted through a path from, for example, the metal cover 6 having a lowest electric resistance value to the heat conductive material 11, the electronic component 8, the circuit board 5, the connector 133, and the connector 132 (GND terminal) in this order, and thus there is a concern that the electronic component on the path may fail.

First Embodiment

Next, a configuration of the electronic control device B according to a first embodiment of the present invention will be described. As illustrated in FIGS. 6, 7, 8A, and 8B, the metal cover 6 and the actuator cover 12 are brought into contact with each other at, for example, one location, and a conductive portion 13 is provided.

That is, in the present embodiment, the electronic control device B that controls an actuator includes at least the circuit board 5, the electronic component 8 mounted on the circuit board 5, the resin case 7 (insulating case) that holds the circuit board 5, the metal cover 6 (first conductive cover) that covers the resin case 7, the actuator cover 12 (second conductive cover) that holds the resin case 7 and covers an opening portion of the actuator, and the conductive portion 13 that make the metal cover 6 (first conductive cover) and the actuator cover 12 (second conductive cover) conductive.

In this manner, a path having a small electric resistance value can be provided, and static electricity applied to the metal cover 6 flows through a path from the metal cover 6 to the actuator cover 12 and the GND in this order, and does not pass through the electronic component 8. Accordingly, damage to the electronic component 8 can be prevented. Further, by providing the conductive portion 13 at only one location, for example, it is possible to reduce received heat from the lubricating oil inside the transmission, and it is possible to realize a highly reliable electronic control device even in a structure that is mechanically and electrically integrated.

In the present embodiment, the electronic control device B includes the fixing member 2 (metal cover fixing screw) that fixes the metal cover 6 (first conductive cover) to the resin case 7 (insulating case) in a non-contact state with the actuator cover 12 (second conductive cover), and the fixing member 3 (resin case fixing screw) that fixes the resin case 7 to the actuator cover 12 in a non-contact state with the metal cover 6.

In this manner, the metal cover 6 (first conductive cover), the resin case 7 (insulating case), and the actuator cover 12 (second conductive cover) can be integrally fixed, and heat is less likely to be transmitted from the actuator cover 12 (second conductive cover) to the metal cover 6 via the fixing member 2 (metal cover fixing screw) or the fixing member 3 (resin case fixing screw). The fixing member 2 is not limited to a screw, and may be, for example, caulking, an adhesive, or a snap-fit. The fixing member 3 is not limited to a screw, and may be caulking, an adhesive, or a snap-fit.

Further, as described above, in the present embodiment, the conductive portion 13 make the metal cover 6 (first conductive cover) and the actuator cover 12 (second conductive cover) conductive only in one location. In this manner, heat is less likely to be transmitted from the actuator cover 12 (second conductive cover) to the metal cover 6.

Specifically, the metal cover 6 (first conductive cover) has a terminal-shaped portion 6T, and the actuator cover 12 (second conductive cover) has a pedestal 12P facing the terminal-shaped portion 6T. The conductive portion 13 includes the terminal-shaped portion 6T of the metal cover 6 and the pedestal 12P of the actuator cover 12.

Further, the electronic control device B also includes the fixing member 1 that fixes the circuit board 5 to the resin case 7 (insulating case). The fixing member 1 is, for example, a screw, caulking, an adhesive, or a snap-fit.

As described above, according to the present embodiment, it is possible to suppress failure of an electronic component due to static electricity.

Second Embodiment

As illustrated in FIGS. 9, 10, 11A, and 11B, by fastening the metal cover 6 and the actuator cover 12 with a fixing member 4 (conduction screw), conduction between the metal cover 6 and the actuator cover 12 can be maintained even in a case where large vibration is applied, and an electronic control device with higher reliability than that in the first embodiment can be realized.

That is, the metal cover 6 (first conductive cover) and the actuator cover 12 (second conductive cover) are fixed by the conductive portion 13. In the present embodiment, the metal cover 6 (first conductive cover) and the actuator cover 12 (second conductive cover) are fixed at only one location by the conductive portion 13. In this manner, heat is less likely to be transmitted from the actuator cover 12 (second conductive cover) to the metal cover 6.

Specifically, the conductive portion 13 includes the fixing member 4 (conduction screw) that fixes the metal cover 6 (first conductive cover) to the actuator cover 12 (second conductive cover). The fixing member 4 is made from a conductive material such as conductive resin or conductive metal.

Third Embodiment

As illustrated in FIGS. 12, 13, 14A, and 14B, even in a case where the resin case 7 is arranged between the metal cover 6 and the actuator cover 12, the same effect as that of the second embodiment can be obtained.

That is, in the present embodiment, the fixing member 4 (conduction screw) fixes the metal cover 6 (first conductive cover) and the resin case 7 (insulating case) to the actuator cover 12 (second conductive cover) in such a manner that the metal cover 6 (first conductive cover) and the resin case 7 (insulating case) are overlapped with each other.

Fourth Embodiment

As illustrated in FIGS. 15, 16, 17A, and 17B, by separating the conductive portion 13 from the circuit board, heat transfer resistance from the conductive portion 13 to the electronic component 8 can be increased as compared with that in the third embodiment. It is generally known that heat transfer resistance is defined by an equation below, and separating the conductive portion 13 from the circuit board is equivalent to increasing I in the equation below. For this reason, electric heat resistance $R_T$ increases.

$$R_T = I/kA$$

Here, $R_T$: electric heat resistance [k/W], I: thickness [m], k: heat conductivity [W/m/K], and A: heat transfer area [m²].

Therefore, it is possible to prevent damage to the electronic component due to static electricity and to make received heat from the lubricating oil inside the transmission further less likely to be transmitted to the electronic component 8.

However, with respect to the holding of the resin case 7 or the metal cover 6, a distance between fixing points can be shortened as a portion as close to the circuit board 5 as possible is fixed, and vibration resistance of the electronic control device B can be improved. In view of the above, for example, by making a minimum distance L1 between the fixing member 4 (conduction screw) and a circuit board end portion 5a longer than a minimum distance L2 between the fixing member 2 (metal cover fixing screw) and the circuit board end portion 5a or a minimum distance L3 between the fixing member 3 (resin case fixing screw) and the circuit board end portion 5a, a highly reliable electronic control device can be realized.

That is, in the present embodiment, the minimum distance L1 between the fixing member 4 (conduction screw) and the circuit board 5 is longer than the maximum distance L2 between the fixing member 2 (metal cover fixing screw) and the circuit board 5. Further, the minimum distance L1 between the fixing member 4 (conduction screw) and the circuit board 5 is longer than the maximum distance L3 between the fixing member 3 (resin case fixing screw) and the circuit board 5.

Fifth Embodiment

Figure 18A:
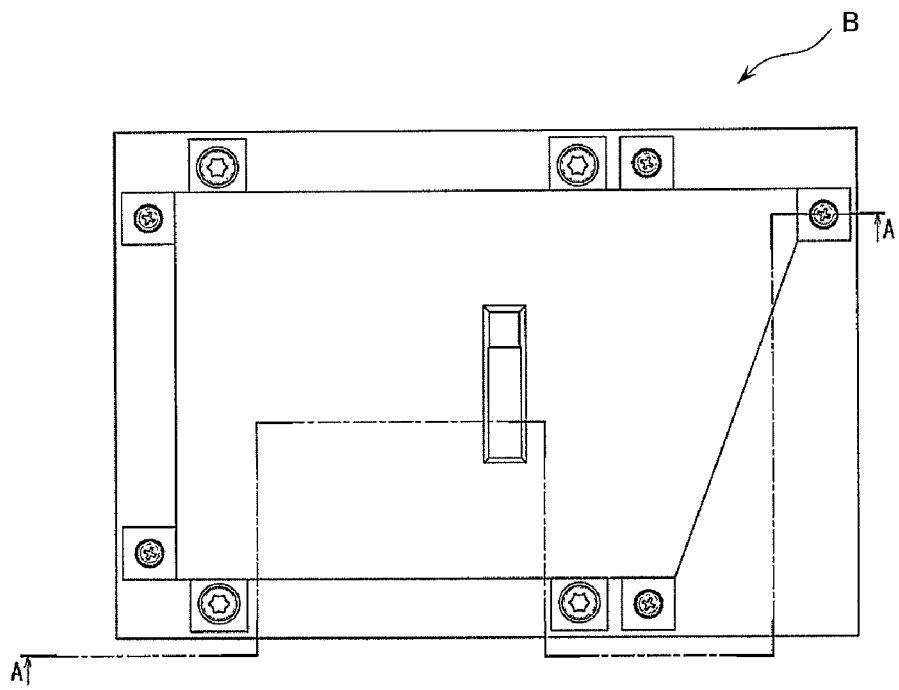
FIG. 18A is a diagram illustrating a cutting line of the electronic control device according to a fifth embodiment of the present invention.
Figure 18B:
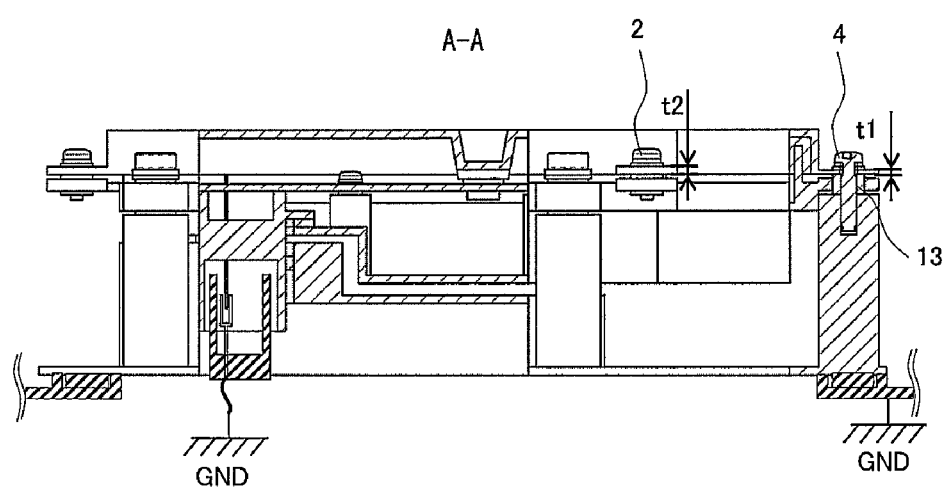
FIG. 18B is a cross-sectional view of the electronic control device according to the fifth embodiment of the present invention.

As illustrated in FIGS. 18A and 18B, heat transfer resistance can also be increased by reducing the thickness of the metal cover 6. Reducing the thickness of the metal cover 6 is equivalent to reducing A in the above equation, and the electric heat resistance $R_T$ increases. Therefore, it is possible to make received heat from the lubricating oil inside the transmission further less likely to be transmitted to the electronic component 8.

However, uniformly reducing the thickness of the entire metal cover directly leads to reduction in mechanical strength of the metal cover 6. For this reason, vibration resistance and impact resistance of the electronic control device B are reduced. In particular, reducing the thickness of the fixing member 2 (metal cover fixing screw) holding the metal cover 6 is likely to lead to damage to the metal cover 6. For this reason, for example, by making a metal cover thickness t1 of the conductive portion thinner than a metal cover thickness t2 of the fixing member 2 (metal cover fixing screw), a highly reliable electronic control device can be realized.

That is, in the present embodiment, the thickness t1 of the metal cover 6 (first conductive cover) in the conductive portion 13 is thinner than the thickness t2 of the metal cover 6 (first conductive cover) around the fixing member 2.

Sixth Embodiment

Figure 19:
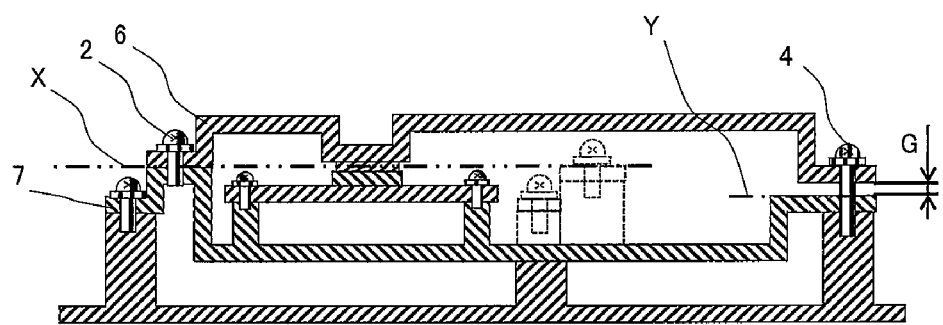
FIG. 19 is a cross-sectional view of the electronic control device at the time of assembly.
Figure 19:
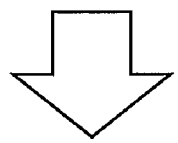
Figure 19:
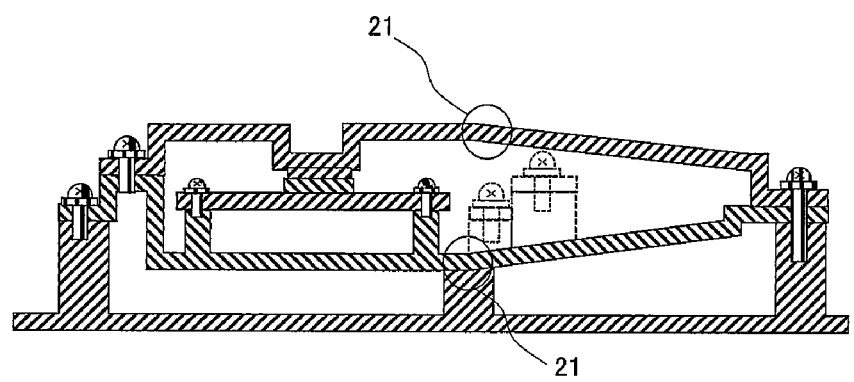

In the electronic control devices up to the fifth embodiment, another problem other than electrostatic resistance and heat resistance occurs. As illustrated in FIG. 19, since there are two types of mating components of the resin case 7 and the actuator cover 12 to which the metal cover 6 is assembled, assembling criteria of these may be different. For example, in a case where a reference surface Y fastened by the fixing member 4 (conduction screw) is different in height from a reference surface X fastened by the fixing member 2 (metal cover fixing screw), a gap G may be generated in the conductive portion 13 due to dimensional tolerance, warpage, or the like of each component. High stress may be generated in the metal cover 6 or the resin case 7 due to forcible fastening with the fixing member 4 (conduction screw) (21).

Figure 20:
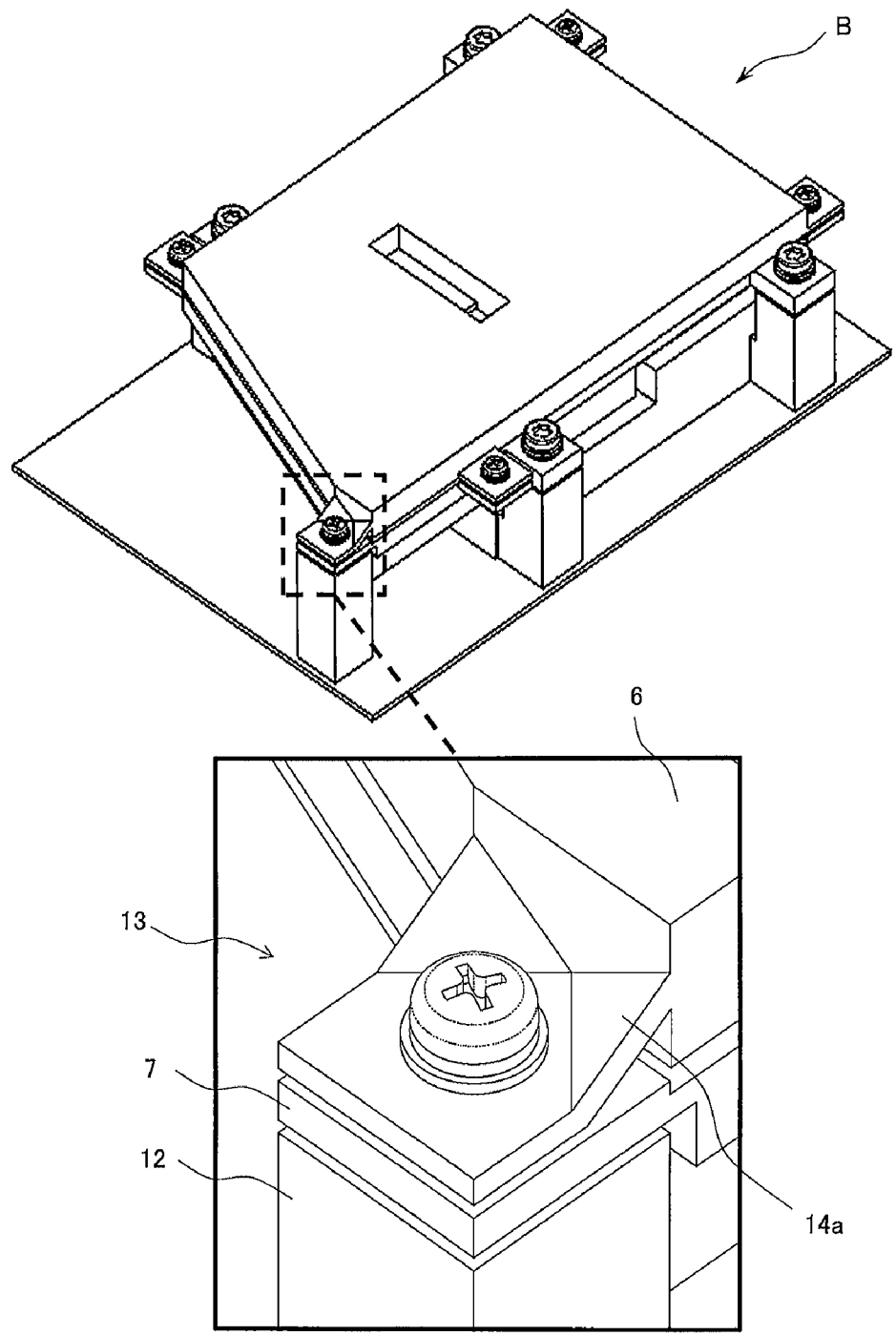
FIG. 20 is a perspective view of the electronic control device according to a sixth embodiment of the present invention.
Figure 21:
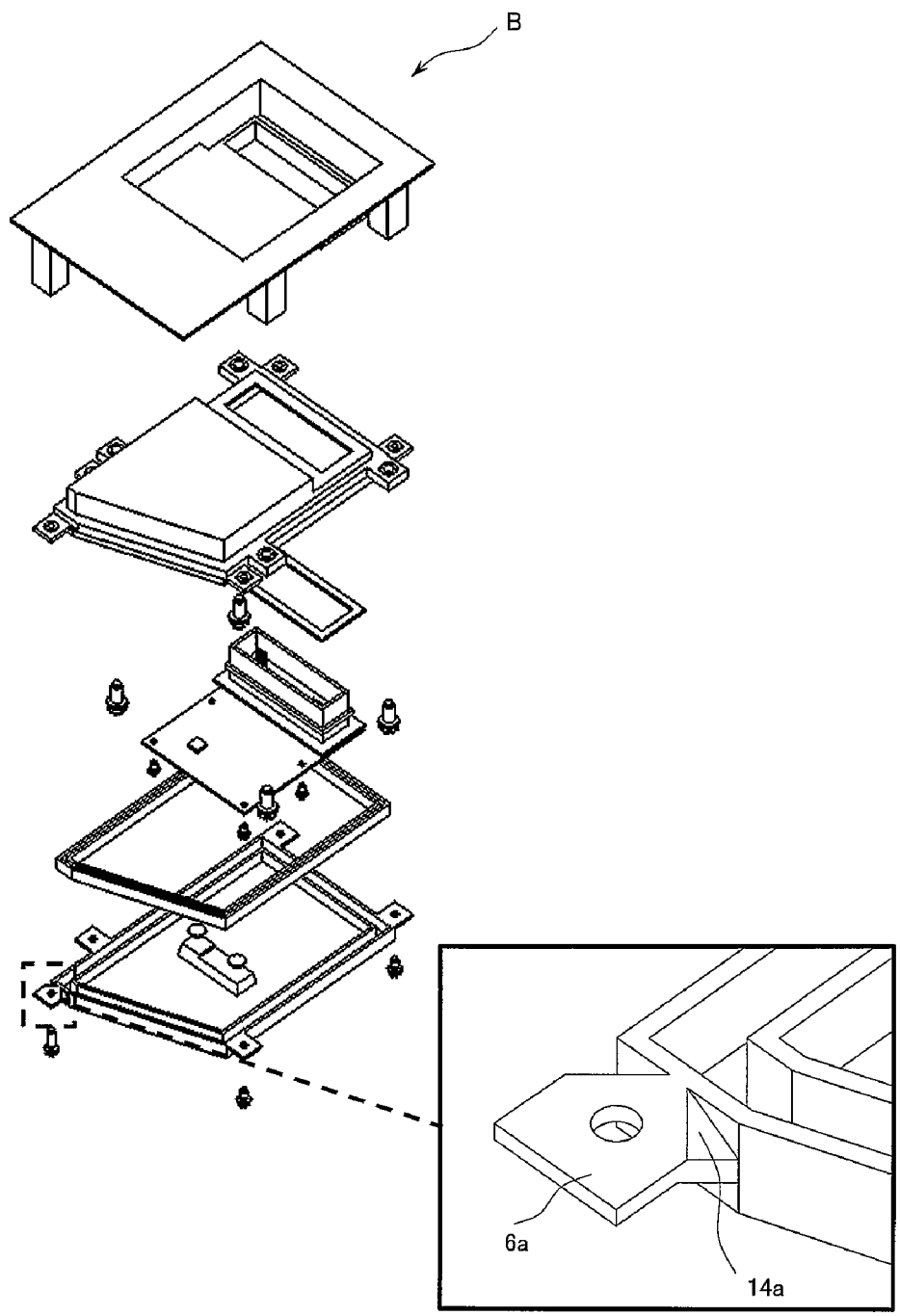
FIG. 21 is a developed view of the electronic control device according to the sixth embodiment of the present invention.

Therefore, in order to solve this, for example, as illustrated in FIGS. 20 and 21, a tapered portion 14a having an angle of approximately 45° with respect to a conduction surface 6a is provided at a base of the metal cover 6 of the conductive portion 13. In this manner, the metal cover 6 is more easily deformed, and stress generated in the metal cover 6 and the resin case 7 can be reduced. Furthermore, by providing the tapered portion 14a, heat transfer resistance of the metal cover 6 is not reduced. Therefore, it is possible to realize an electronic control device with higher reliability than that of the fifth embodiment without reducing electrostatic resistance and heat resistance.

That is, in the present embodiment, the tapered portion 14a is formed in the metal cover 6 (first conductive cover) of the conductive portion 13. The tapered portion 14a includes an inclined surface inclined with respect to a surface of the metal cover 6 (first conductive cover) overlapping the resin case 7 (insulating case) or the actuator cover 12 (second conductive cover). The inclined surface includes two plane-symmetrical surfaces. In the present embodiment, the inclined surface is triangular.

In this manner, it is possible to extend a distance in a direction away from a side surface of the metal cover 6 (first conductive cover) while preventing the tapered portion 14a from interfering with the fixing member 4 (conduction screw). As a result, the metal cover 6 is more easily deformed, and stress generated in the metal cover 6 and the resin case 7 can be reduced.

Seventh Embodiment

Figure 22:
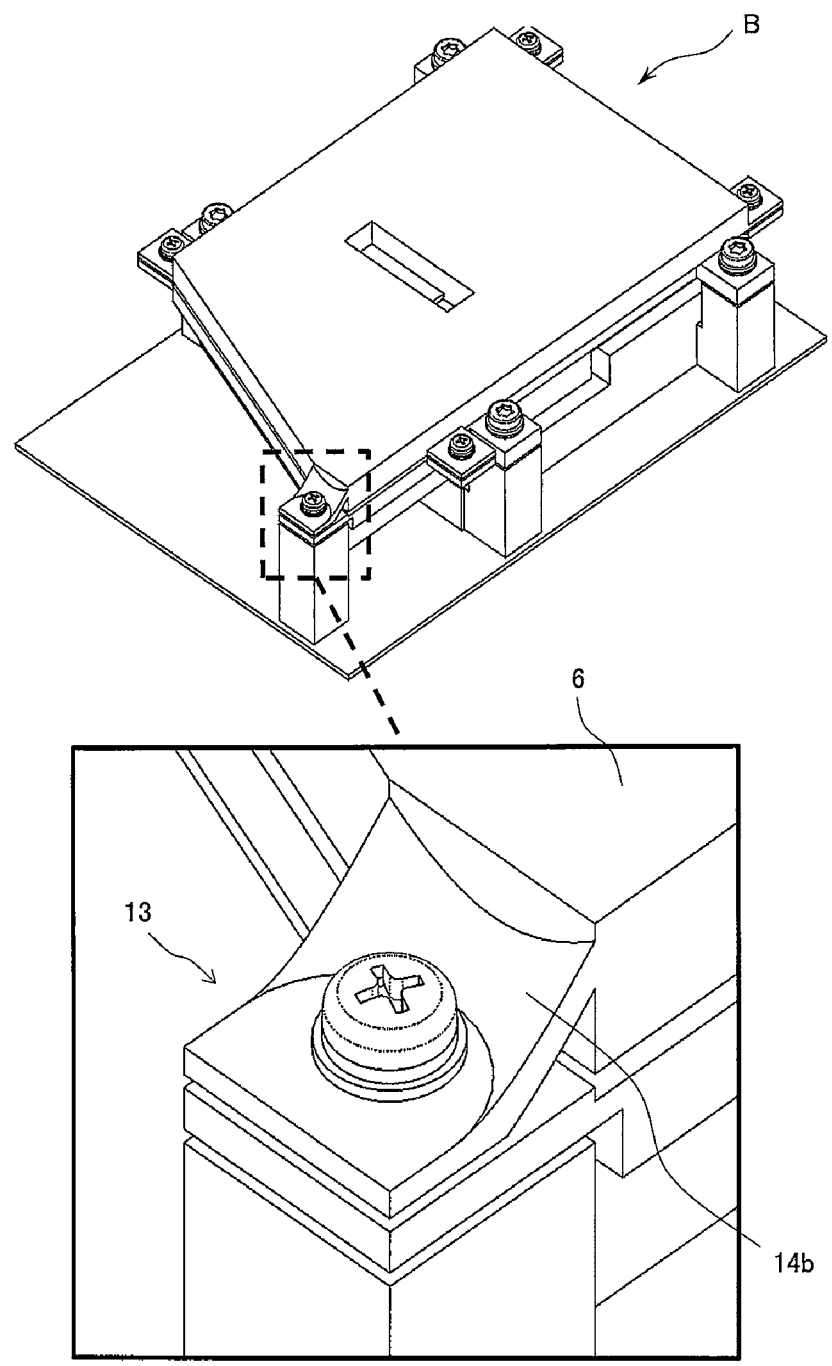
FIG. 22 is a perspective view of the electronic control device according to a seventh embodiment of the present invention.
Figure 23:
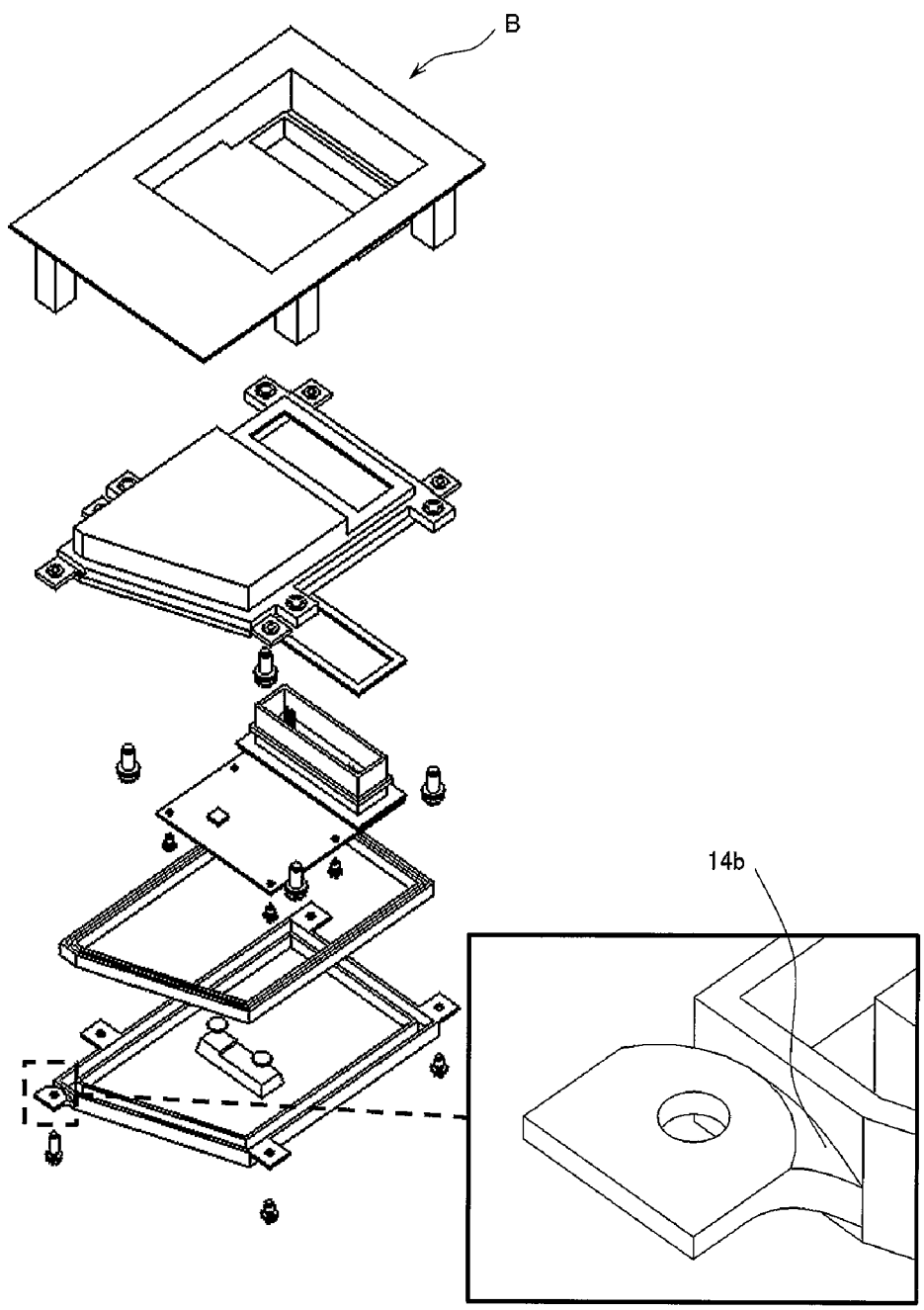
FIG. 23 is a developed view of the electronic control device according to the seventh embodiment of the present invention.

As illustrated in FIGS. 22 and 23, by providing a substantially semicircular tapered portion 14b at a base of the metal cover 6 of the conductive portion 13, the same effect as that of the sixth embodiment can be obtained, and a highly reliable electronic control device can be realized.

That is, in the present embodiment, the tapered portion 14b includes a curved surface. The tapered portion 14 has, for example, a semicircular shape. In other words, the tapered portion 14b has a half pipe shape. In this manner, the metal cover 6 is more easily deformed, and stress generated in the metal cover 6 and the resin case 7 can be reduced. Further, since a large space can be obtained between the fixing member 4 (conduction screw) and the tapered portion 14b, the fixing member 4 can be easily attached.

Eighth Embodiment

Figure 24A:
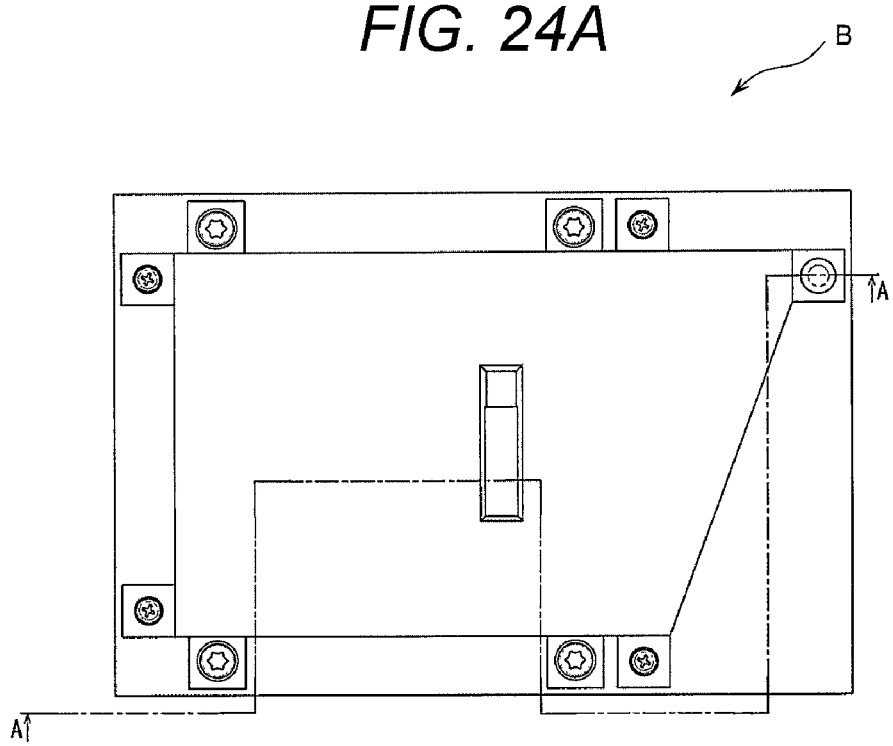
FIG. 24A is a diagram illustrating a cutting line of the electronic control device according to an eighth embodiment of the present invention.
Figure 24B:
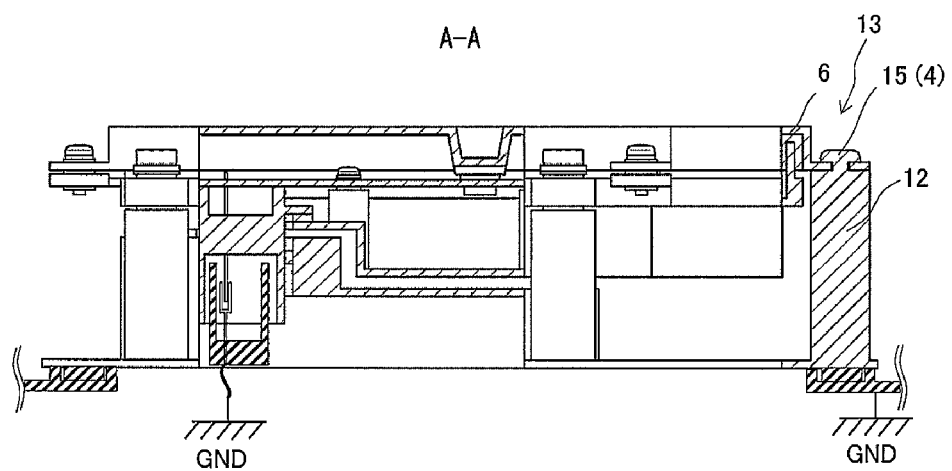
FIG. 24B is a cross-sectional view of the electronic control device according to the eighth embodiment of the present invention.

As illustrated in FIGS. 24A and 24B, the same effect as that of the second embodiment can be obtained by making the conductive portion 13 conductive with a rivet 15.

In other words, the fixing member 4 is the caulking 15. In this manner, for example, the number of parts is reduced.

Ninth Embodiment

Figure 25A:
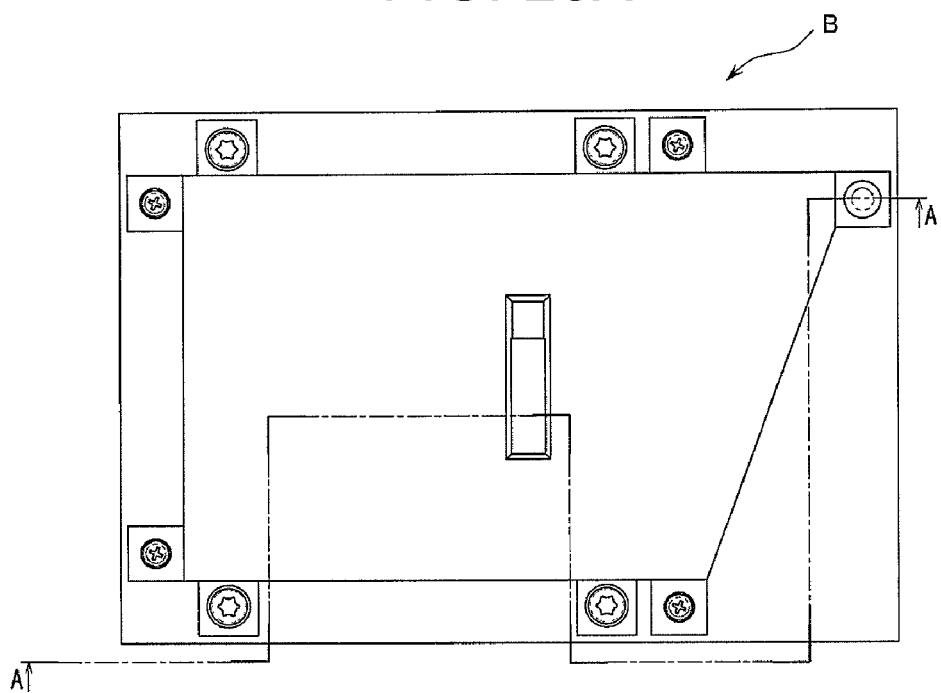
FIG. 25A is a diagram illustrating a cutting line of the electronic control device according to a ninth embodiment of the present invention.
Figure 25B:
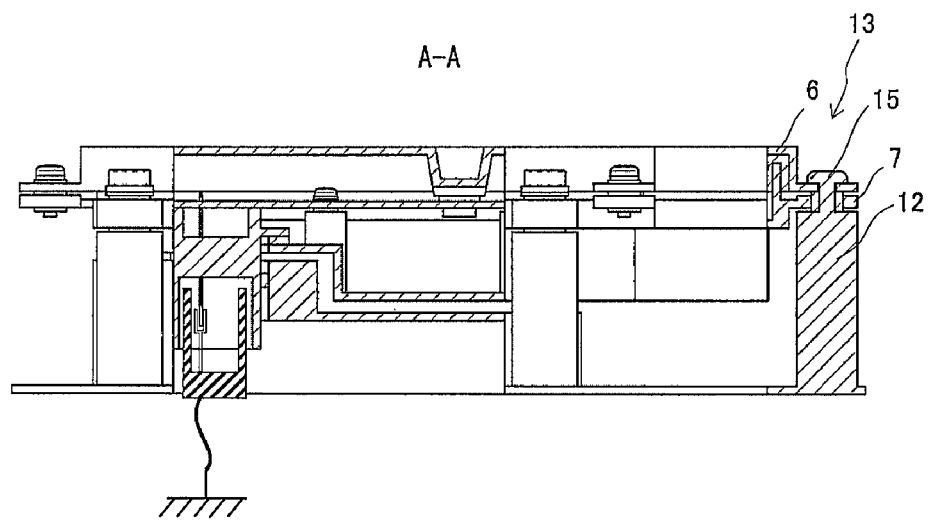
FIG. 25B is a cross-sectional view of the electronic control device according to the ninth embodiment of the present invention.

As illustrated in FIGS. 25A and 25B, the conductive portion 13 is made conductive in a manner that the resin case 7 is penetrated by the rivet 15, so that the same effect as that of the third embodiment can be obtained.

Tenth Embodiment

Figure 26A:
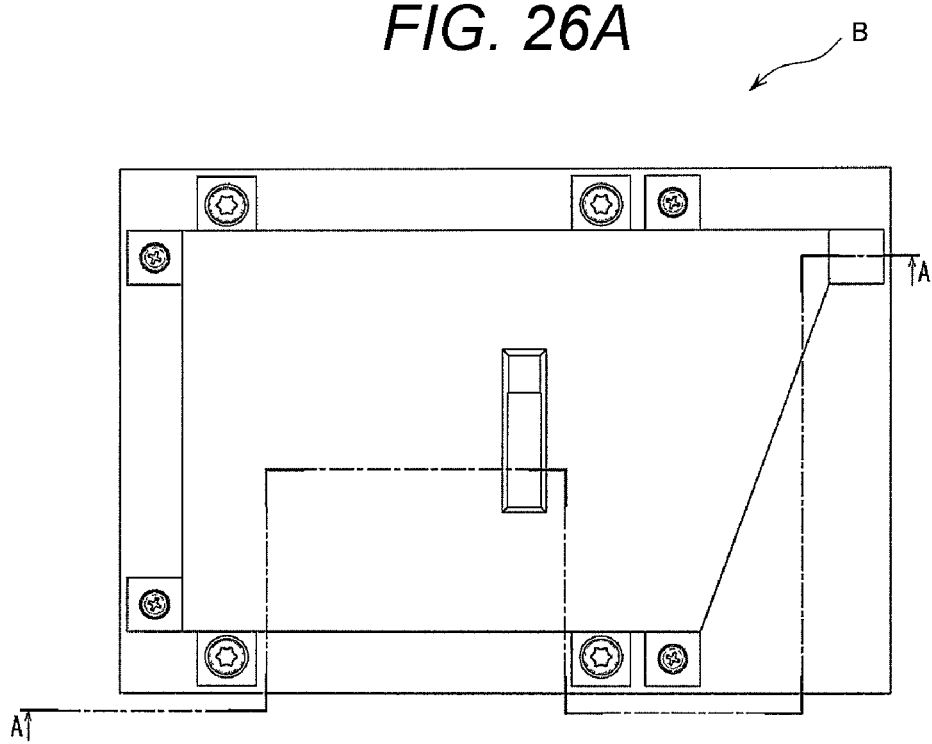
FIG. 26A is a diagram illustrating a cutting line of the electronic control device according to a tenth embodiment of the present invention.
Figure 26B:
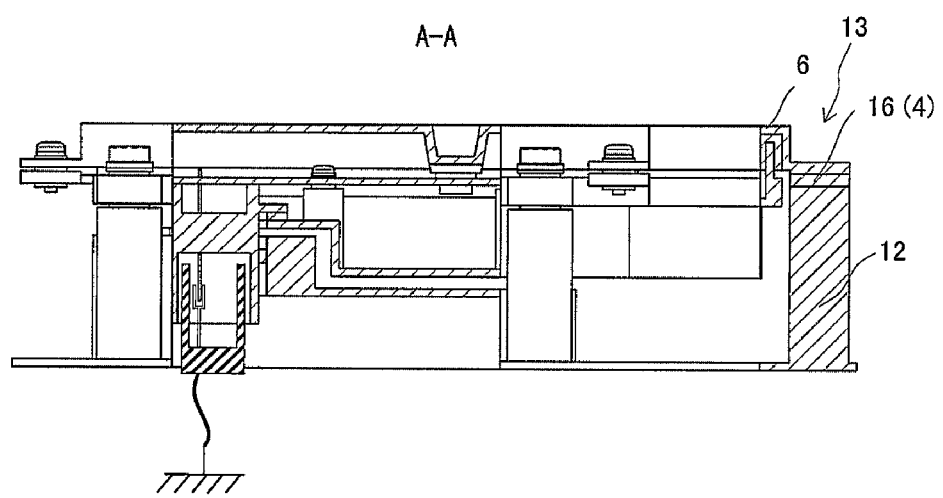
FIG. 26B is a cross-sectional view of the electronic control device according to the tenth embodiment of the present invention.

As illustrated in FIGS. 26A and 26B, the same effect as that of the second embodiment can be obtained by making the conductive portion 13 conductive with an adhesive 16 having conductivity.

In other words, the fixing member 4 is the adhesive 16 having conductivity that makes the metal cover 6 (first conductive cover) and the actuator cover 12 (second conductive cover) conductive. In this manner, for example, it is not necessary to provide a hole for the fixing member 4 in the metal cover 6.

Eleventh Embodiment

Figure 27A:
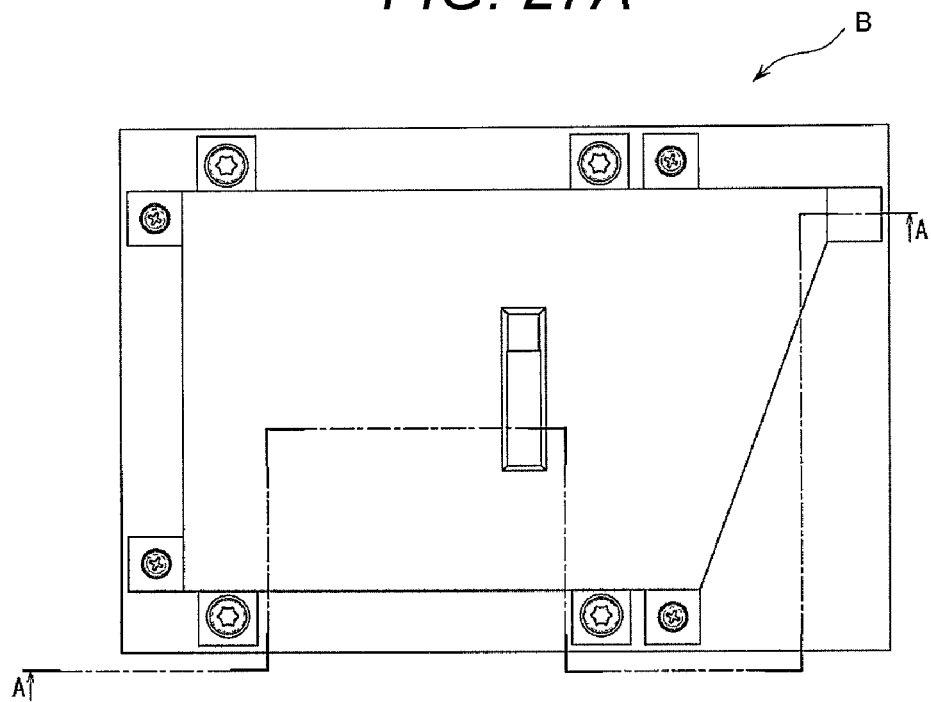
FIG. 27A is a diagram illustrating a cutting line of the electronic control device according to an eleventh embodiment of the present invention.
Figure 27B:
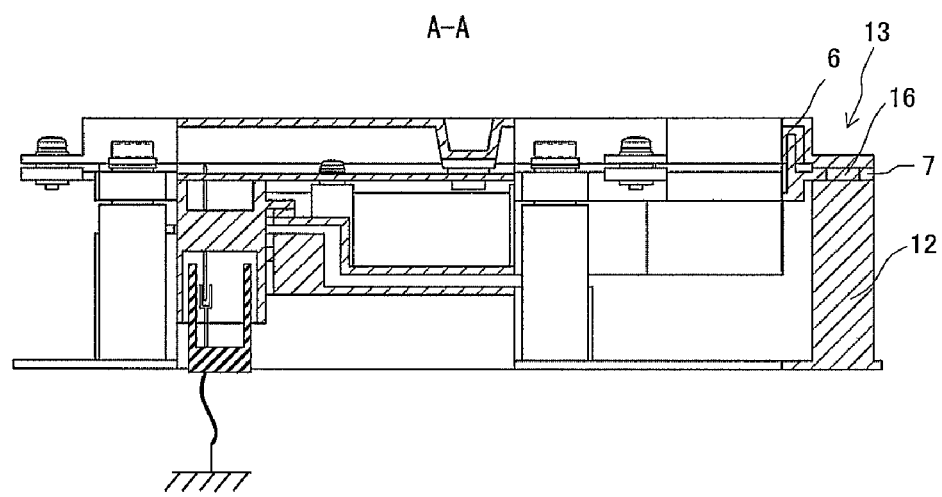
FIG. 27B is a cross-sectional view of the electronic control device according to the eleventh embodiment of the present invention.

As illustrated in FIGS. 27A and 27B, the conductive portion 13 is made conductive in a manner that the resin case 7 is penetrated by the adhesive 16 having conductivity, so that the same effect as that of the third embodiment can be obtained.

Twelfth Embodiment

Figure 28:
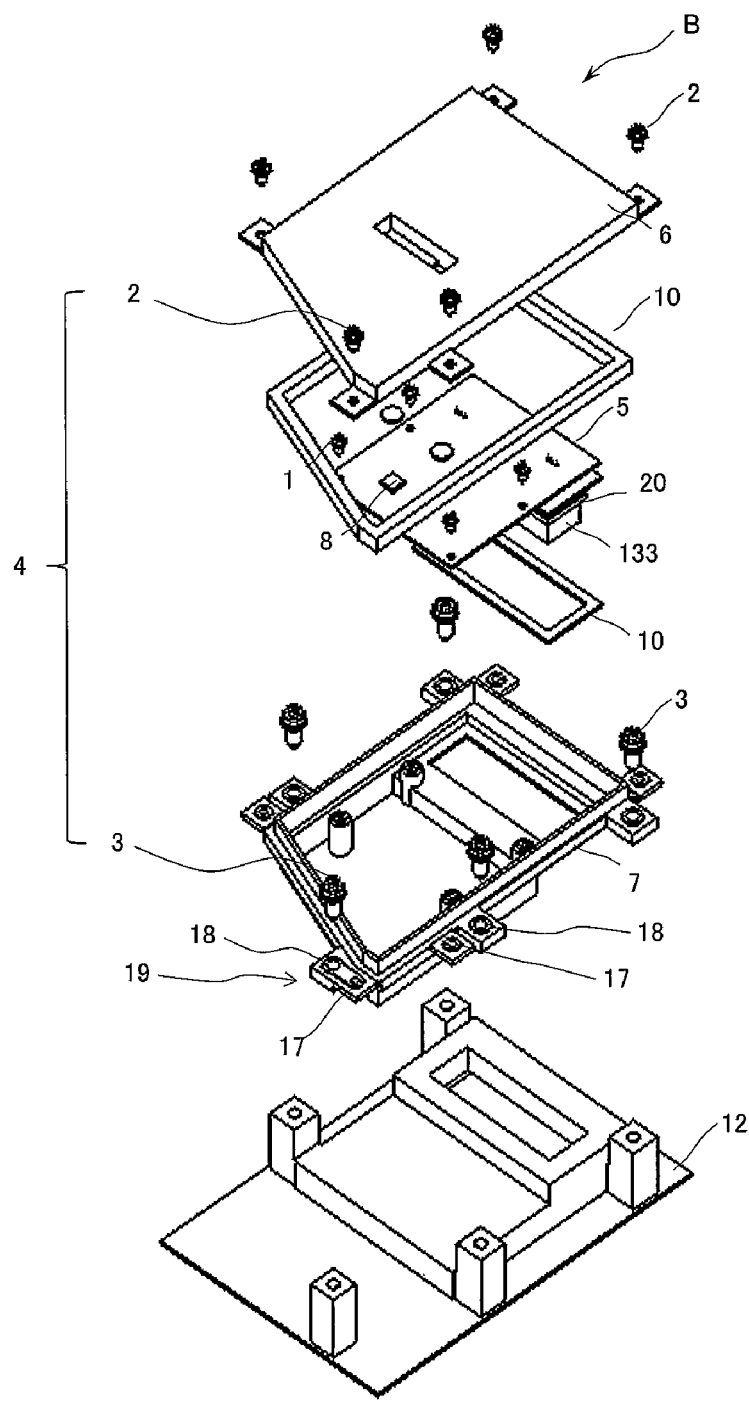
FIG. 28 is a perspective view of the electronic control device according to a twelfth embodiment of the present invention.
Figure 29A:
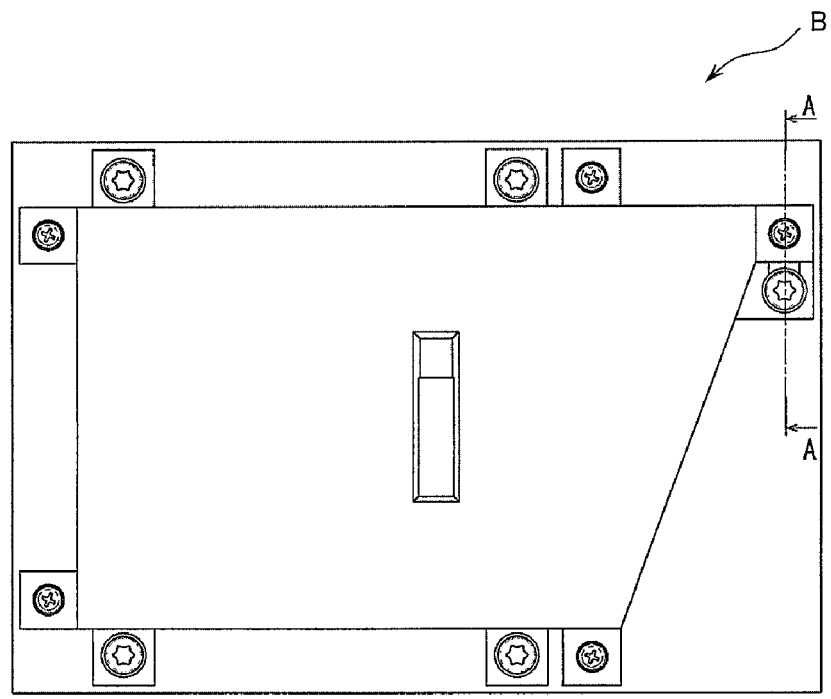
FIG. 29A is a diagram illustrating a cutting line of the electronic control device according to the twelfth embodiment of the present invention.
Figure 29B:
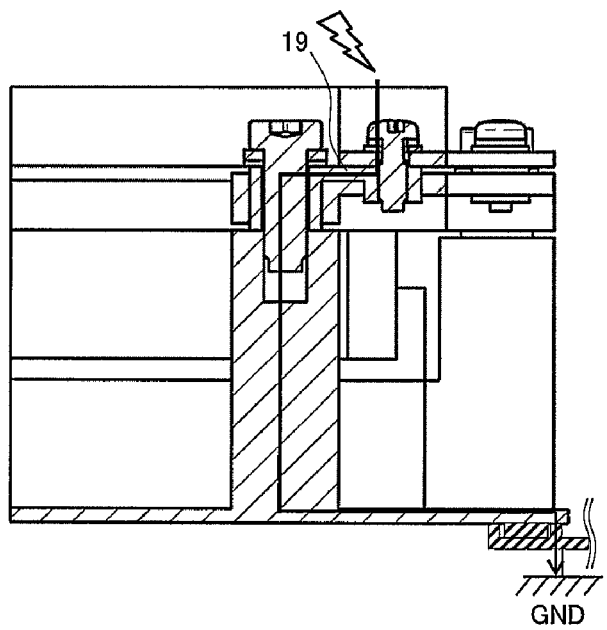
FIG. 29B is a cross-sectional view of the electronic control device according to the twelfth embodiment of the present invention.

It is generally known that a metal nut/collar is inserted into a screw fastening portion of the resin case 7 for the purpose of screw tap processing or resin creep prevention. In view of the above, as illustrated in FIGS. 28, 29A, and 29B, an integrated collar 19 obtained by integrating an insert nut 17 for the fixing member 2 (screw) and an insert collar 18 for the fixing member 3 is provided on the conductive portion 13, so that the same effect as that of the first embodiment can be obtained.

That is, in the present embodiment, the electronic control device B includes the integrated collar 19 (conductive collar) inserted into the resin case 7 (insulating case) in the conductive portion 13. The integrated collar 19 (conductive collar) is formed by integrating a conductive collar 17 corresponding to the fixing member 2 (metal cover fixing screw) and the conductive collar 18 corresponding to the fixing member 3 (resin case fixing screw). That is, the fixing member 4 (conduction screw) includes the fixing member 2 (metal cover fixing screw) and the fixing member 3 (resin case fixing screw).

In this manner, a discharge path of static electricity applied to the metal cover 6 can be secured, and stress generated in the metal cover 6 and the resin case 7 can be reduced.

Note that the present invention is not limited to the above embodiment and includes a variety of variations. For example, the above embodiment is described in detail for easy understanding of the present invention, and the present invention is not necessarily limited to an embodiment that includes all the described configurations. Part of a configuration of a certain embodiment can be replaced with a configuration of another embodiment, and a configuration of a certain embodiment can be added to a configuration of another embodiment. Further, for part of a configuration of each embodiment, other configurations may be added, removed, or replaced with.

The embodiment of the present invention may have aspects described below.

(1). An electronic control device including a circuit board on which an electronic component and a connector are mounted, an insulating case that holds the circuit board, a first conductive cover that covers the insulating case, a heat conductive material that is arranged between the electronic component and the first conductive cover or between the circuit board and the first conductive cover, and a second conductive cover that holds the insulating case and liquid-tightly seal the inside of an actuator, the electronic control device further including a conductive portion that makes the first conductive cover and the second conductive cover conductive.

(2). In the electronic control device of (1), the first conductive cover is fixed to the insulating case in a non-contact state with the second conductive cover at a fixing portion 2, and the insulating case is fixed to the second conductive cover at a fixing portion 3 in a non-contact state with the first conductive cover.

(3). In the electronic control device according to (1) or (2), the conductive portion makes the first conductive cover and the second conductive cover conductive only at one location.

(4). In the electronic control device according to any of (1) to (3), the conductive portion fixes the first conductive cover and the second conductive cover.

(5). In the electronic control device according to any of (1) to (4), the conductive portion fixes the first conductive cover and the second conductive cover only at one location.

(6). In the electronic control device according to any of (1) to (5), a minimum distance L1 between the conductive portion and the circuit board is longer than a maximum distance L2 between the fixing member 2 and the circuit board.

(7). In the electronic control device according to any of (1) to (6), the minimum distance L1 between the conductive portion and the circuit board is longer than a maximum distance L3 between the fixing member 3 and the circuit board.

(8). In the electronic control device according to any of (1) to (7), a thickness of the first conductive cover is larger in the fixing portion 2 than in the conductive portion.

(9). In the electronic control device according to any of (1) to (8), in the first conductive cover, a tapered portion is formed at an inclination of approximately 45° with respect to the conduction surface on the conductive portion.

(9-1). In the electronic control device according to any of (1) to (8), in the first conductive cover, a tapered portion is formed in a substantially semicircular shape on the conductive portion.

(10). In the electronic control device according to any of (1) to (9-1), the conductive portion is caulking.

(11). In the electronic control device of (10), the conductive portion is caulking, and fixes the first conductive cover and the second conductive cover in a manner that the insulating case is sandwiched between them.

(12). In the electronic control device according to any of (1) to (9-1), the conductive portion fixes the first conductive cover and the second conductive cover with a fixing member 4.

(13). In the electronic control device according to any of (1) to (9-1), the conductive portion fixes the first conductive cover and the second conductive cover with a fixing member 4.

(14). In the electronic control device of (13), the fixing member 4 fixes the first conductive cover and the second conductive cover in a manner that the insulating case is sandwiched between them.

(15). In the electronic control device according to any of (13) and (14), the fixing member 4 is a screw.

(16). In the electronic control device according to any of (13) and (14), the fixing member 4 is an adhesive having conductivity that makes the first conductive cover and the second conductive cover conductive.

(17). In the electronic control device according to any of (1) to (16), the circuit board is fixed to the insulating case by caulking.

(18). In the electronic control device according to any of (1) to (16), the circuit board is fixed to the insulating case by a snap-fit.

(19). In the electronic control device according to any of (1) to (16), the circuit board is fixed to the insulating case with a fixing member 1.

(20). In the electronic control device according to (19), the fixing member 1 is a screw.

(21). In the electronic control device according to (19), the fixing member 1 is an adhesive.

(22). In the electronic control device according to any of (1) to (21), the fixing portion 2 is caulking.

(23). In the electronic control device according to any of (1) to (21), the fixing portion 2 is a snap-fit.

(24). In the electronic control device according to any of (1) to (21), the fixing portion 2 is fixed with the fixing member 2.

(25). In the electronic control device according to (24), the fixing member 2 is a screw.

(26). In the electronic control device according to (24), the fixing member 2 is an adhesive.

(27). In the electronic control device according to any of (1) to (26), the fixing portion 3 is caulking.

(28). In the electronic control device according to any of (1) to (26), the fixing portion 3 is a snap-fit.

(29). In the electronic control device according to any of (1) to (26), the fixing portion 3 is fixed with the fixing member 3.

(30). In the electronic control device according to (29), the fixing member 3 is a screw.

(31). In the electronic control device according to (29), the fixing member 3 is an adhesive.

(32). In the electronic control device according to any of (1) to (31), the fixing member 2 and the fixing member 4 are the same.

(33). In the electronic control device according to any of (1) to (32), the fixing member 3 and the fixing member 4 are the same.

(34). In the electronic control device according to any of (1) to (33), in the insulating case, a first conductive collar is inserted into the conductive portion.

(35). In the electronic control device according to (34), the first conductive collar is integral with a second conductive collar inserted in the fixing portion 2 in the insulating case.

(36). In the electronic control device according to (34), the first conductive collar is integral with a third conductive collar inserted in the fixing portion 3 in the insulating case.

REFERENCE SIGNS LIST

B electronic control device
1 fixing member (substrate fixing screw)
2 fixing member (metal cover fixing screw)
3 fixing member (resin case fixing screw)
4 fixing member (conduction screw)
5 circuit board
5*a* circuit board end portion
6 metal cover (first conductive cover)
6*a* conduction surface
7 resin case (insulating case)
8 electronic component
10 sealing member (adhesive)
11 heat conductive material
12 actuator cover (second conductive cover)
13 conductive portion
14*a* tapered portion of approximately 45°
14*b* substantially semicircular tapered portion
15 rivet
16 adhesive having conductivity
17 insert nut for fixing member 2 (screw)
18 insert collar for fixing member 3 (screw)
19 integrated collar
20 sealing member (rubber packing)
21 stress generated portion
L1 minimum distance between fixing member 4 (conduction screw) and circuit board end portion 5*a*
L2 maximum distance between fixing member 2 (metal cover fixing screw) and circuit board end portion 5*a*
L3 maximum distance between fixing member 3 (resin case fixing screw) and circuit board end portion 5*a*
t1 metal cover thickness of conductive portion
t2 metal cover thickness of fixing member 2 (metal cover fixing screw) portion
103 transmission
131 transmission case
132 transmission connector (female side)
133 transmission connector (male side)
131*a* opening portion of transmission case
134 main body portion of transmission case
G gap
X reference 1
Y reference 2

The invention claimed is:

1. An electronic control device that controls an actuator, the electronic control device comprising:
   a circuit board;
   an electronic component mounted on the circuit board;
   an insulating case that holds the circuit board;
   a first fixing member that fixes the circuit board to the insulating case;
   a first conductive cover that covers the insulating case;
   a second conductive cover that holds the insulating case and covers an opening portion of the actuator;
   a conductive portion that makes the first conductive cover and the second conductive cover conductive;
   a second fixing member that fixes the first conductive cover to the insulating case in a non-contact state with the second conductive cover; and
   a third fixing member that fixes the insulating case to the second conductive cover in a non-contact state with the first conductive cover.

2. The electronic control device according to claim 1, wherein the conductive portion makes the first conductive cover and the second conductive cover conductive only at one location.

3. The electronic control device according to claim 2, wherein the first conductive cover and the second conductive cover are fixed at the conductive portion.

4. The electronic control device according to claim 3, wherein the first conductive cover and the second conductive cover are fixed at the only one location at the conductive portion.

5. The electronic control device according to claim 1, wherein
the conductive portion includes a fourth fixing member that fixes the first conductive cover to the second conductive cover, and
a minimum distance L1 between the fourth fixing member and the circuit board is longer than a maximum distance L2 between the second fixing member and the circuit board.

6. The electronic control device according to claim 5, wherein the minimum distance L1 between the fourth fixing member and the circuit board is longer than a maximum distance L3 between the third fixing member and the circuit board.

7. The electronic control device according to claim 1, wherein
a thickness t1 of the first conductive cover in the conductive portion is smaller than a thickness t2 of the first conductive cover around the second fixing member.

8. The electronic control device according to claim 1, wherein a tapered portion is formed on the first conductive cover in the conductive portion.

9. The electronic control device according to claim 8, wherein the tapered portion includes an inclined surface inclined with respect to a surface of the first conductive cover overlapping the insulating case or the second conductive cover.

10. The electronic control device according to claim 9, wherein the inclined surface includes two plane-symmetrical surfaces.

11. The electronic control device according to claim 10, wherein the inclined surface is triangular.

12. The electronic control device according to claim 8, wherein the tapered portion includes a curved surface.

13. The electronic control device according to claim 12, wherein the tapered portion is semicircular.

14. The electronic control device according to claim 12, wherein the tapered portion has a half pipe shape.

15. The electronic control device according to claim 1, wherein the conductive portion includes a first conductive collar inserted into the insulating case.

16. The electronic control device according to claim 15, wherein the first conductive collar is obtained by integrating a second conductive collar corresponding to the second fixing member and a third conductive collar corresponding to the third fixing member.

17. The electronic control device according to claim 16, wherein a fourth fixing member includes the second fixing member and the third fixing member.

18. The electronic control device according to claim 1, wherein
the first conductive cover includes a terminal-shaped portion,
the second conductive cover includes a pedestal opposed to the terminal-shaped portion, and
the conductive portion includes:
the terminal-shaped portion of the first conductive cover; and
the pedestal of the second conductive cover.

19. The electronic control device according to claim 18, wherein the conductive portion includes a fourth fixing member that fixes the first conductive cover to the second conductive cover.

20. The electronic control device according to claim 19, wherein the fourth fixing member is a screw.

21. The electronic control device according to claim 19, wherein the fourth fixing member is caulking.

22. The electronic control device according to claim 19, wherein the fourth fixing member is an adhesive having conductivity that makes the first conductive cover and the second conductive cover conductive.

23. The electronic control device according to claim 19, wherein the fourth fixing member fixes the first conductive cover and the insulating case to the second conductive cover in such a manner that the first conductive cover and the insulating case are overlapped with each other.

24. The electronic control device according to claim 1, wherein the first fixing member is a screw, caulking, an adhesive, or a snap-fit.

25. The electronic control device according to claim 1, wherein the second fixing member is a screw, caulking, an adhesive, or a snap-fit.

26. The electronic control device according to claim 1, wherein the third fixing member is a screw, caulking, an adhesive, or a snap-fit.

* * * * *